(12) United States Patent
Yasuda et al.

(10) Patent No.: US 9,507,112 B2
(45) Date of Patent: Nov. 29, 2016

(54) PHOTOELECTRIC CONVERSION MODULE AND METHOD OF MANUFACTURING PHOTOELECTRIC CONVERSION MODULE

(75) Inventors: Hiroki Yasuda, Mito (JP); Kouki Hirano, Hitachinaka (JP); Yoshinori Sunaga, Hitachinaka (JP); Juhyun Yu, Mito (JP); Masataka Satou, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 1350 days.

(21) Appl. No.: 13/354,673

(22) Filed: Jan. 20, 2012

(65) Prior Publication Data

US 2012/0195545 A1 Aug. 2, 2012

(30) Foreign Application Priority Data

Jan. 31, 2011 (JP) ................................. 2011-018141

(51) Int. Cl.
*G02B 6/12* (2006.01)
*G02B 6/43* (2006.01)
*G02B 6/42* (2006.01)
*H01L 31/02* (2006.01)
*H01L 31/0203* (2014.01)
*H01L 25/16* (2006.01)

(52) U.S. Cl.
CPC .................. *G02B 6/43* (2013.01); *G02B 6/428* (2013.01); *G02B 6/4214* (2013.01); *H01L 31/0203* (2013.01); *H01L 31/02005* (2013.01); *H01L 25/167* (2013.01); *H01L 2224/16225* (2013.01)

(58) Field of Classification Search
CPC ............ H01L 31/0203; G02B 6/3652; G02B 6/3886
See application file for complete search history.

(56) References Cited

U.S. PATENT DOCUMENTS

| 4,897,711 A | 1/1990 | Blonder et al. |
| 6,043,427 A * | 3/2000 | Nishimoto .................... 136/258 |
| 6,263,565 B1 * | 7/2001 | Gotoh et al. .................... 29/852 |
| 7,174,062 B2 * | 2/2007 | Fukuyama ........... G02B 6/3636 385/14 |
| 7,438,481 B2 * | 10/2008 | Numata ............... G02B 6/3644 385/49 |
| 2003/0189213 A1 | 10/2003 | Igaki et al. |
| 2008/0108205 A1 * | 5/2008 | Nishi .................. H01L 27/1446 438/463 |
| 2008/0226221 A1 | 9/2008 | Bidnyk et al. |
| 2009/0016732 A1 | 1/2009 | Ueno et al. |
| 2010/0142886 A1 | 6/2010 | Warashina et al. |

FOREIGN PATENT DOCUMENTS

| JP | 02-009183 A | 1/1990 |
| JP | 06-151903 A | 5/1994 |
| JP | 08-008818 A | 1/1996 |

(Continued)

OTHER PUBLICATIONS

Japanese Office Action dated Jan. 9, 2014 (and English translation thereof) in counterpart Japanese Application No. 2011-018141.

*Primary Examiner* — Sung Pak
*Assistant Examiner* — Hoang Tran
(74) *Attorney, Agent, or Firm* — Holtz, Holtz & Volek PC

(57) ABSTRACT

A photoelectric conversion module includes: a photoelectric conversion element and an IC chip mounted on a mounting surface of a substrate; and an electrode provided on a side surface of the substrate, electrically connected to the IC chip, and having a concave shape sunk deeper than other portions of the side surface of the substrate.

11 Claims, 24 Drawing Sheets

(56) References Cited

FOREIGN PATENT DOCUMENTS

| JP | 11-131283 A | 5/1999 |
| JP | 2002-343983 A | 11/2002 |
| JP | 2004-006753 A | 1/2004 |
| JP | 2005-285886 A | 10/2005 |
| JP | 2005-332983 A | 12/2005 |
| JP | 2007-324303 A | 12/2007 |
| JP | 2009-21459 A | 1/2009 |
| JP | 2010-135630 A | 6/2010 |

* cited by examiner

PHOTOELECTRIC CONVERSION MODULE AND METHOD OF MANUFACTURING PHOTOELECTRIC CONVERSION MODULE

BACKGROUND OF THE INVENTION

Field of the Invention

The present invention relates to a photoelectric conversion module and a method of manufacturing a photoelectric conversion module.

Description of the Related Art

As transmission mediums, for example, in the connection between a server and a switch in a data center and in the connection between digital AV (audio visual) devices, optical fibers are also used in addition to metal wires. Further, in recent years, the use of optical fibers as transmission mediums, that is, optical interconnection, also in information processing devices such as mobile phones and personal computers has been considered. Refer to Japanese Patent Application Laid-open No. 2009-21459, for instance.

When the optical fibers are used, a photoelectric conversion module converting an electrical signal to an optical signal or converting an optical signal to an electrical signal is required. For example, a photoelectric conversion module disclosed in Japanese Patent Application Laid-open No. 2007-324303 includes an inorganic material substrate, and a photoelectric conversion element and an IC chip are mounted on the inorganic material substrate. A package is airtightly joined to the inorganic material substrate, and a package-side circuit pattern is provided on the package. The IC chip is electrically connected to an external part through the package-side circuit pattern and package-side solder balls.

In the photoelectric conversion module disclosed in Japanese Patent Application Laid-open No. 2007-324303, the structure of the package-side circuit pattern is complicated, which has made a cost reduction difficult.

SUMMARY OF THE INVENTION

It is an object of the present invention to provide a photoelectric conversion module having an electrode for external connection with a simple structure.

It is another object of the present invention to provide a method of manufacturing the photoelectric conversion module.

According to one aspect of the present invention, there is provided a photoelectric conversion module including: a substrate having a light transmitting property and having a mounting surface; a photoelectric conversion element and an IC chip mounted on the mounting surface of the substrate; and an electrode provided on a side surface of the substrate, electrically connected to the IC chip, and having a concave shape sunk deeper than other portions of the side surface.

According to another aspect of the present invention, there is provided a method of manufacturing a photoelectric conversion module, the method including: a preparation step of preparing a first wafer to be divided into substrates each having a light transmitting property and having a mounting surface; a mounting step of mounting, on the first wafer, photoelectric conversion elements and IC chips corresponding to the respective substrates; a boring step of forming through holes penetrating through the first wafer, at positions where the first wafer is to be divided; a plating step of plating wall surfaces of the through holes; and a dividing step of dividing the first wafer into the substrates after the plating step.

Further scope of applicability of the present invention will become apparent from the detailed description given hereinafter. The detailed description and embodiments are only given as examples though showing preferred embodiments of the present invention, and therefore, from the contents of the following detailed description, changes and modifications of various kinds within the spirits and scope of the invention will become apparent to those skilled in the art.

BRIEF DESCRIPTION OF THE DRAWINGS

The present invention will be fully understood from the following detailed description and the accompanying drawings. The accompanying drawings only show examples and are not intended to restrict the present invention. In the accompanying drawings.

DETAILED DESCRIPTION

Hereinafter, embodiments of the present invention will be described with reference to the drawings.

Figure 1:
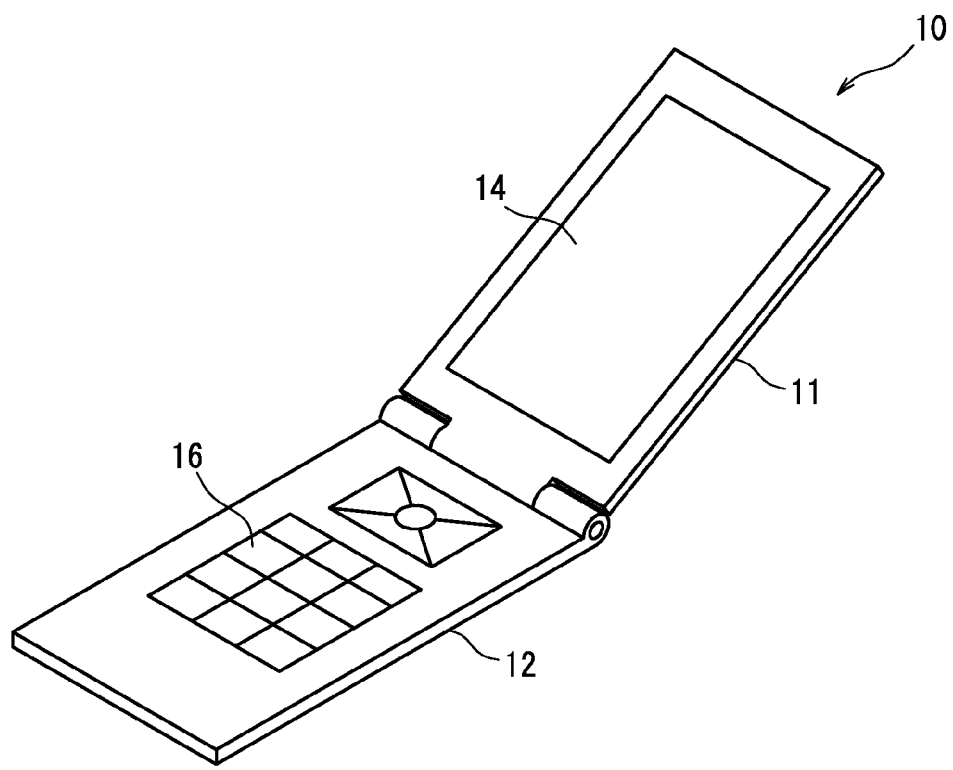
FIG. 1 is a perspective view showing a schematic structure of a mobile phone including an optical wiring using photoelectric conversion modules of a first embodiment.

FIG. 1 is a perspective view schematically showing an outer appearance of a mobile phone 10. The mobile phone 10 is of, for example, a fold type, in which a first case 11 and a second case 12 are coupled via a hinge. A liquid crystal panel 14 is placed on the first case 11, and buttons 16 are placed on the second case 12, and a user is capable of obtaining information from an image displayed on the liquid crystal panel 14.

Figure 2:
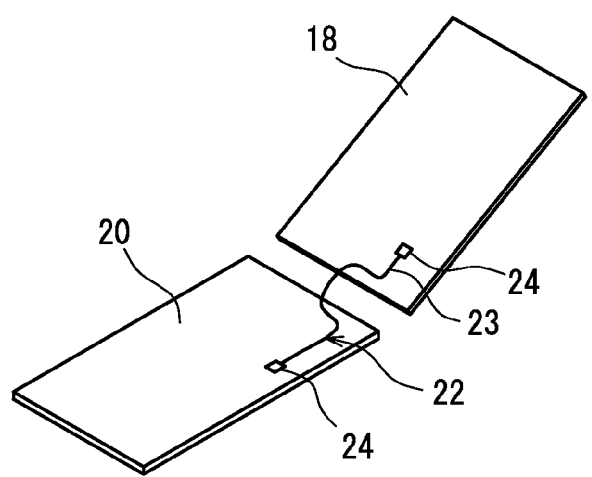
FIG. 2 is a schematic perspective view showing a first motherboard and a second motherboard used in the mobile phone in FIG. 1 as well as the optical wiring.

FIG. 2 shows a first motherboard 18 and a second motherboard 20 disposed in the first case 11 and the second case 12 respectively. Though not shown, electric components forming a driving circuit of the liquid crystal panel 14 are mounted on the first motherboard 18, and electric components forming an input circuit connected to the buttons 16, a communication circuit, and an image processing circuit are mounted on the second motherboard 20.

The driving circuit on the first motherboard 18 and the image processing circuit on the second motherboard 20 are connected by an optical wiring 22. That is, the driving circuit receives image data from the image processing circuit through the optical wiring 22 and makes the liquid crystal display panel 14 display an image based on the received image data.

Photoelectric Conversion Module

First Embodiment

The optical wiring 22 is constituted by an optical fiber 23 and photoelectric conversion modules 24, 24 of a first embodiment integrally provided at both ends of the optical fiber 23.

Figure 3:
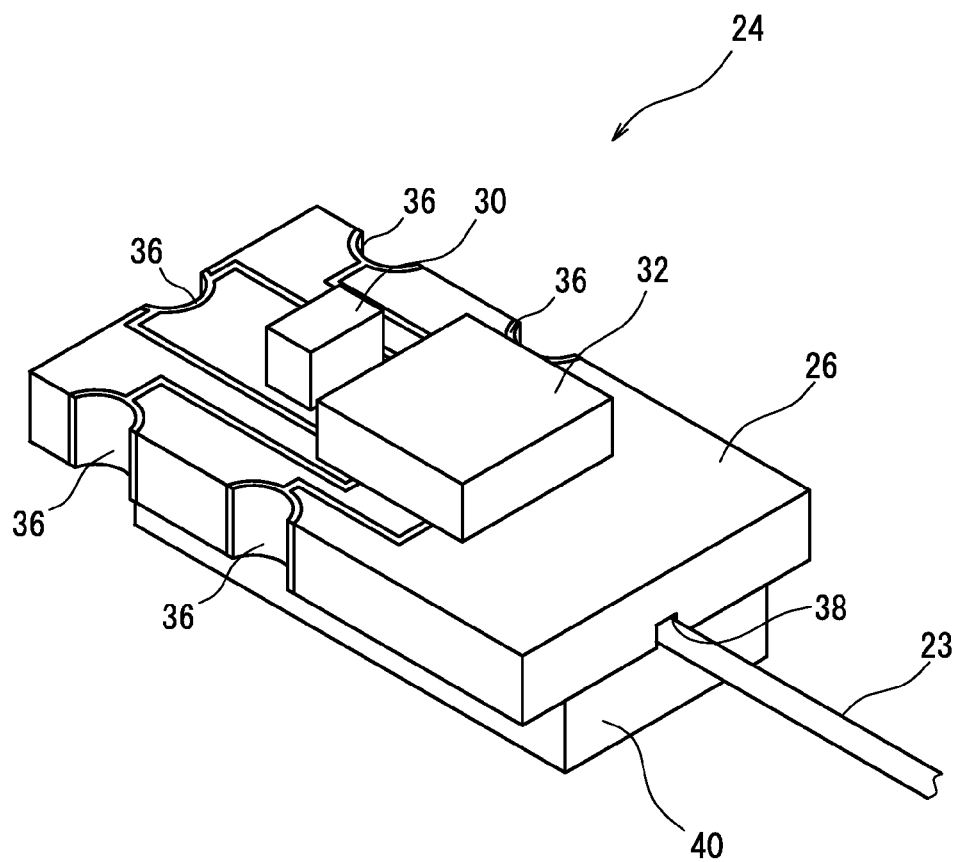
FIG. 3 is a perspective view schematically showing an outer appearance of the photoelectric conversion module of the first embodiment.

FIG. 3 is a perspective view schematically showing an outer appearance of the photoelectric conversion module 24. The photoelectric conversion module 24 includes a substrate 26 having a light transmitting property, and the substrate 26 is made of, for example, resin, an inorganic material, or a composite material of resin and an inorganic material. As the inorganic material, one kind selected from a group consisting of glass, silicon, and sapphire is usable.

In this embodiment, the substrate 26 is made of, for example, glass, and has a thickness within a range of not less than 20 μm nor more than 400 μm, a vertical length within a range of not less than 1 mm nor more than 4 mm, and a lateral length within a range of not less than 1 mm nor more than 4 mm.

On one surface (mounting surface) of the substrate 26, a photoelectric conversion element 30 and an IC (integrated circuit) chip 32 are mounted by, for example, flip-chip.

In more detail, in the photoelectric conversion module 24 connected to the second motherboard 20, the photoelectric conversion element 30 is a light-emitting element such as LD (laser diode), and the IC chip 32 forms a driving circuit for driving the photoelectric conversion element 30.

Further, in the photoelectric conversion module 24 connected to the first motherboard 18, the photoelectric conversion element 30 is a light-receiving element such as PD (photodiode) and the IC chip 32 forms an amplifier circuit for amplifying an electric signal output by the light-receiving element.

The photoelectric conversion element 30 is of a surface emitting type or of a surface receiving type, and its emission part or incident part is disposed to face the mounting surface.

A plurality of concave portions extending from end to end of the substrate 26 in its thickness direction are formed in side surfaces of the substrate 26, and on the whole areas of surfaces of the concave portions, filmy conductive members (electrodes) 36 having conductivity are formed. The conductive members 36 have a concave shape sunk deeper than portions, of the side surfaces of the substrate 26, located on both sides of the conductive members 36.

The conductive members 36 are each made of, for example, a film of a single metal selected from a group consisting of Au, Cu, and Ni or an alloy thereof, or made of a laminate of these films. Preferably, the conductive members 36 are each a laminate in which a Cu plating film, a Ni plating film, and an Au plating film are stacked in the order mentioned and the Au plating film is located on an uppermost layer.

On a surface (rear surface), of the substrate 26, opposite the mounting surface, a holding groove 38 is provided, and a tip portion of the optical fiber 23 is disposed in the holding groove 38. On the rear surface of the substrate 26, a plate-shaped reinforcing member 40 is fixed so as to cover the holding groove 38. The reinforcing member 40 is made of, for example, glass. A thickness of the reinforcing member 40 is, for example, within a range of not less than 100 μm nor more than 500 μm.

Figure 4:
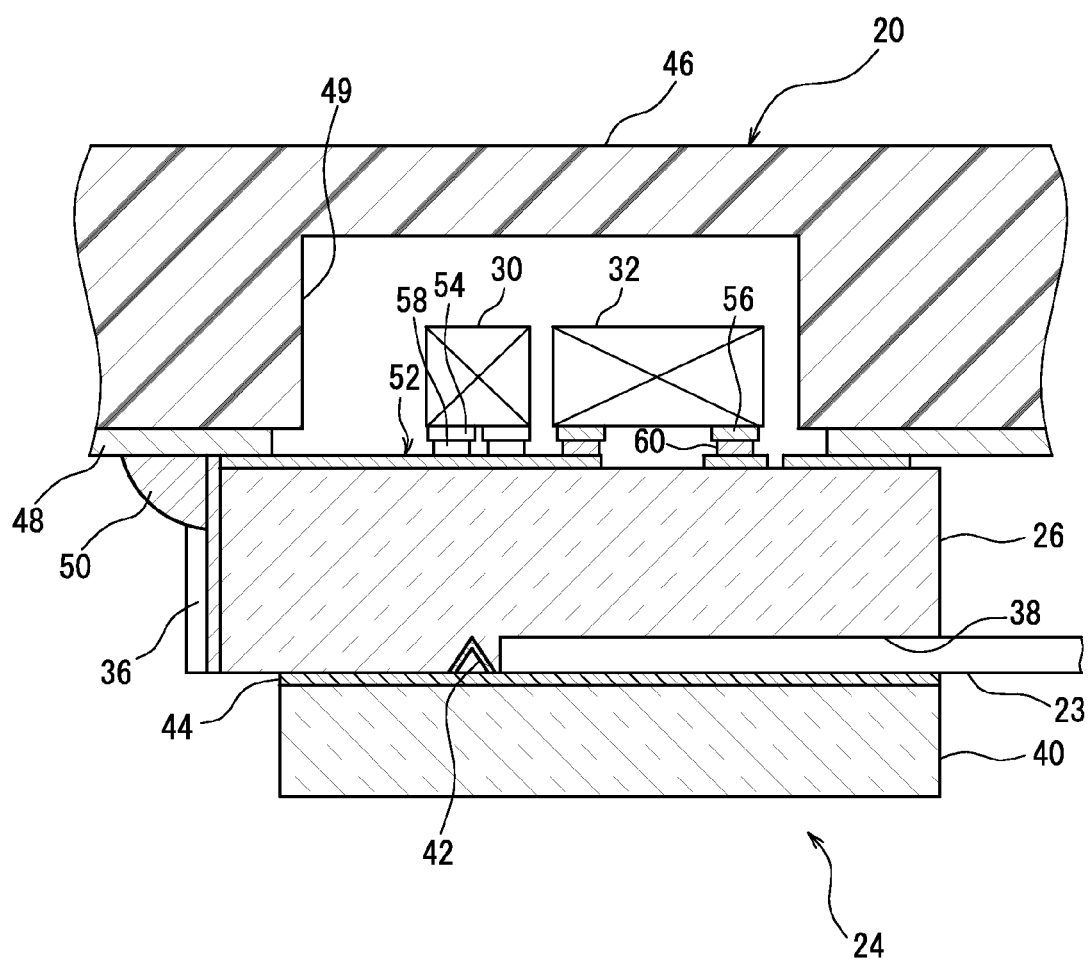
FIG. 4 is a schematic cross-sectional view of the photoelectric conversion module attached to the second motherboard.

FIG. 4 is a schematic cross-sectional view of the photoelectric conversion module 24 mounted on the second motherboard 20.

The holding groove 38 extends along the substrate 26 in an arrangement direction of the photoelectric conversion element 30 and the IC chip 32 (hereinafter, simply referred to as an arrangement direction D). The holding groove 38 has a quadrangular sectional shape, that is, an angular U shape, and the holding groove 38 is a U-groove.

In this embodiment, as a preferable form, in terms of the arrangement direction D, one end, of the holding groove 38, located on the IC chip 32 side is opened in a side surface of the substrate 26 and the other end of the holding groove 38 is formed by a wall surface. Further, the tip portion of the optical fiber 23 is fixed in the holding groove 38 by an adhesive, and a tip surface of the optical fiber 23 abuts on the wall surface of the holding groove 38 at the other end.

Further, a V-groove is formed in the rear surface of the substrate 26, and on a wall surface of the V-groove, a vapor deposition film made of metal such as, for example, Au or the like is formed. The vapor deposition film forms a mirror 42, and the mirror 42 forms an optical element optically coupling the photoelectric conversion element 30 and the tip surface of the optical fiber 23 via the substrate 26.

Note that the holding groove 38 and the V-groove can be formed by members different from the substrate 26. A possible example may to form a resin layer by applying a resin material on the rear surface of the substrate and form the holding groove and the V-groove in this resin layer.

The reinforcing member 40 is fixed on the rear surface of the substrate 26 via an adhesive layer 44 made of an adhesive. The reinforcing member 40 covers the holding groove 38, and together with the substrate 26, it firmly holds the tip portion of the optical fiber 23. An area of a surface, of the reinforcing member 40, bonded to the substrate 26 is smaller than an area of the rear surface of the substrate 26. The reinforcing member 40 is fixed to the rear surface of the substrate 26 so that part of the vicinity of an outer edge of the rear surface of the substrate 26 is exposed.

The second motherboard 20 is composed of a rigid board main body 46 made of, for example, glass epoxy resin and a conductor pattern 48 made of a conductor such as copper. As a depression 49 receiving the photoelectric conversion element 30 and the IC chip 32, for example, a U-groove is provided in the board main body 46 of the second motherboard 20. The conductor pattern 48 of the second motherboard 20 is connected to the conductive members 36 of the photoelectric conversion module 24 by connection parts 50 made of, for example, solder.

On the mounting surface of the substrate 26, a conductor pattern 52 for electrically connecting the photoelectric conversion element 30 and the IC chip 32 and for electrically connecting the IC chip 32 and the conductive members 36 is provided. To form the conductor pattern 52, a conductive thin film made of, for example, copper or the like is etched.

The photoelectric conversion element 30 and the IC chip 32 have, as input/output terminals, a plurality of electrode pads 54 and a plurality of electrode pads 56 respectively, and the electrode pads 54, 56 are connected to the conductor pattern 52 of the substrate 26 via bumps 58, 60 made of, for example, Au. The conductor pattern 52 extends up to the concave portions of the side surfaces of the substrate 26 and is connected to the conductive members 36.

Figure 5:
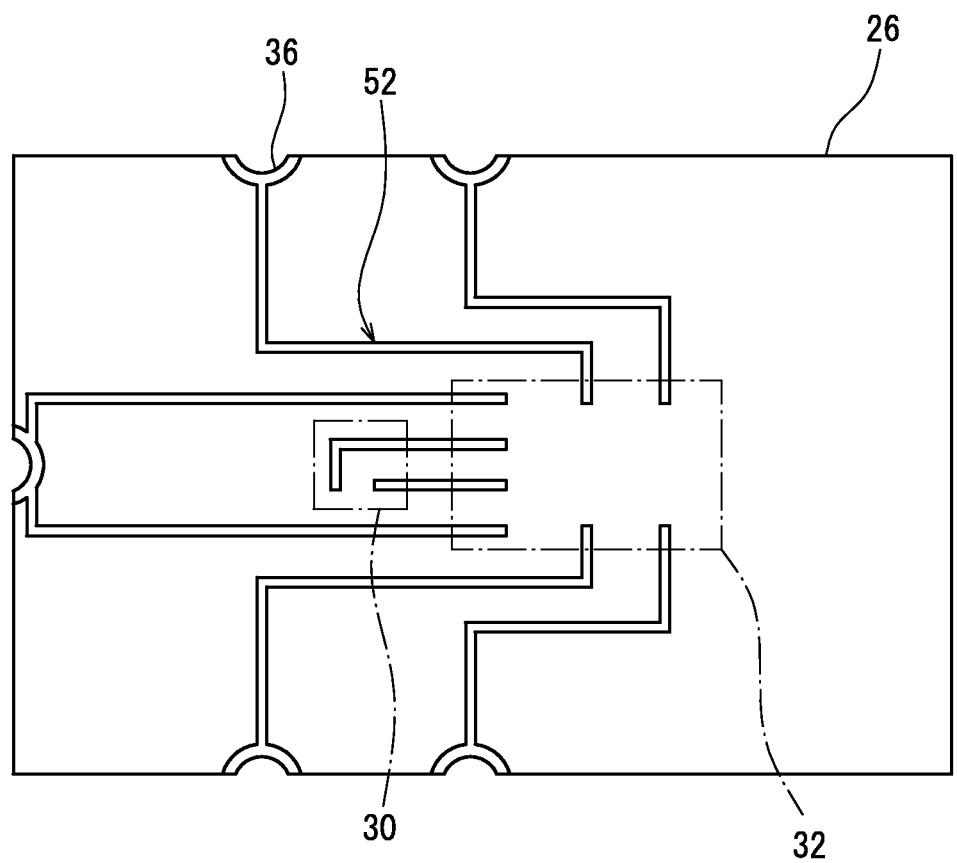
FIG. 5 is a plane view schematically showing a mounting surface of a substrate, with a photoelectric conversion element and an IC chip being removed.

FIG. 5 is a plane view schematically showing the mounting surface of the substrate 26. As shown in FIG. 5, the conductive members 36 are each electrically connected to the IC chip 32 via the conductor pattern 52.

Hereinafter, a preferable method of manufacturing the above-described photoelectric conversion module 24 will be described.

Figure 6:
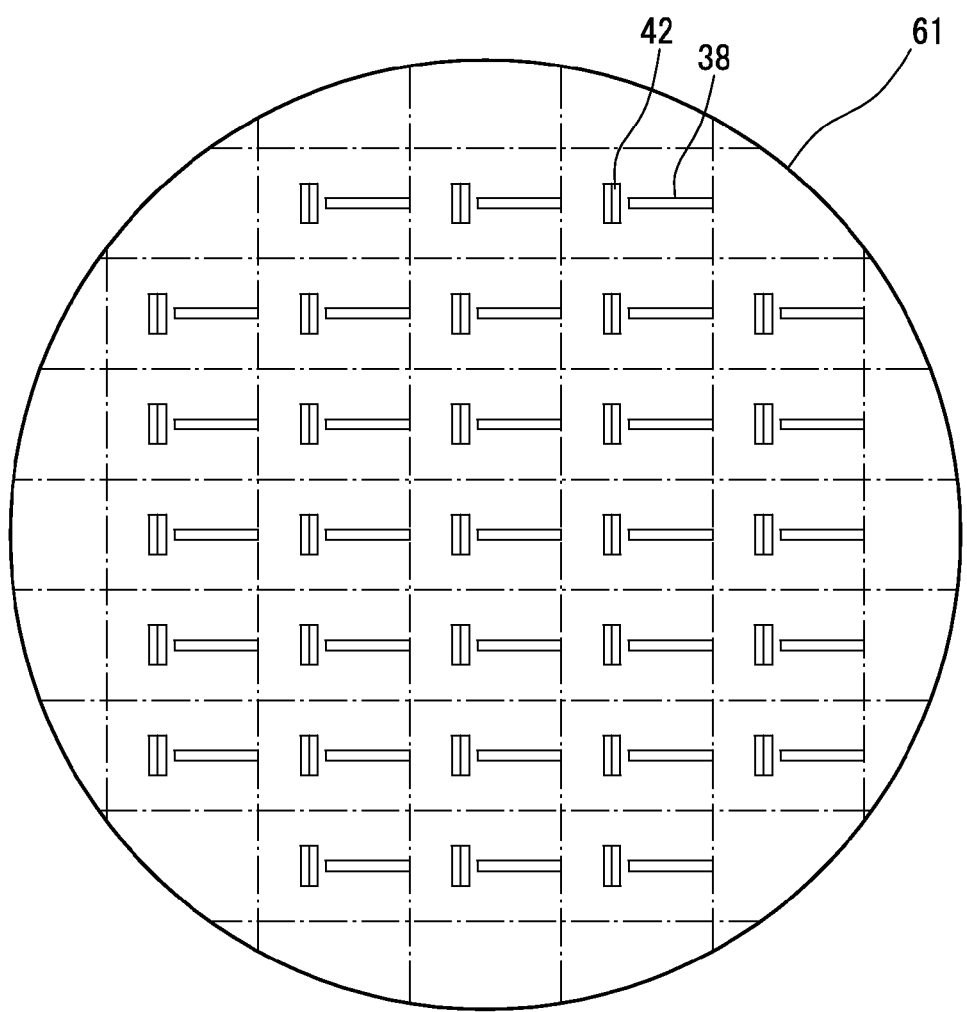
FIG. 6 is a schematic plane view used to explain a forming step of a holding groove and a mirror in a method of manufacturing the photoelectric conversion module in FIG. 3.

First, as shown in FIG. 6, a first wafer 61 is prepared as a material of the substrate 26 (preparation step). The first wafer 61 is finally cut along the dashed lines to be divided into the plural substrates 26.

On one surface (rear surface) of the prepared first wafer 61, the V-grooves and the holding grooves 38 are formed in correspondence to the respective substrates 26 obtained after the division, and the metal films are vapor-deposited on the V-grooves to form the mirrors 42 (holding groove/mirror forming step).

Another alternative may be to apply a resin material on one surface of the first wafer 61 to form a resin layer and in this resin layer, form the holding grooves 38 by exposure and development processes and form the V-groove by dicing or the like.

Figure 7:
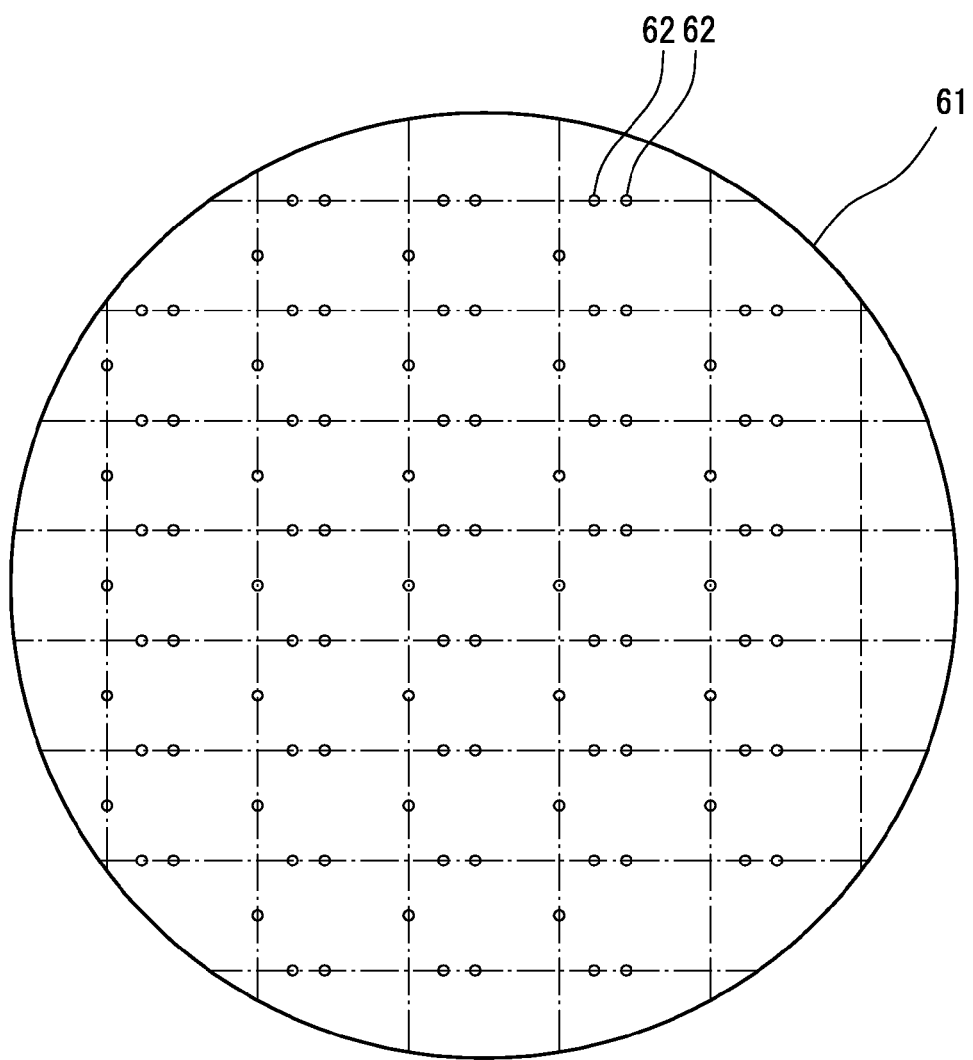
FIG. 7 is a schematic plane view used to explain a boring step of through holes in the method of manufacturing the photoelectric conversion module in FIG. 3.

Next, as shown in FIG. 7, through holes 62 penetrating through the first wafer 61 are formed by, for example, drilling, sandblasting, etching, or the like, preferably by drilling (boring step). The through holes 62 are formed at predetermined positions on boundaries between the substrates 26.

After the boring step, on wall surfaces of the through holes 62, electroless plating or electrolytic plating is applied to form the plating films (conductive films) (plating step). Preferably, to form the plating films, Cu, Ni, and Au are applied in this order and gold plating is a surface layer of the plating film.

Figure 8:
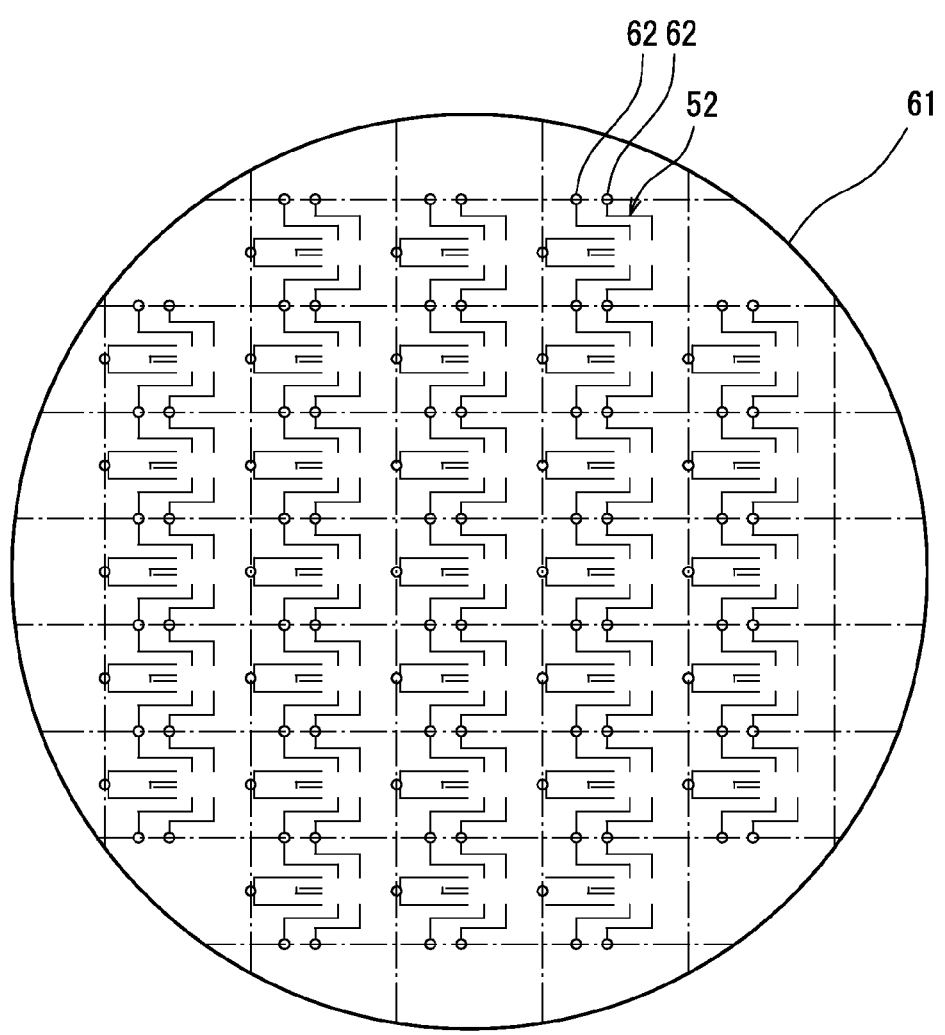
FIG. 8 is a schematic plane view used to explain a forming step of a conductor pattern in the method of manufacturing the photoelectric conversion module in FIG. 3.

Then, as shown in FIG. 8, on the other surface (mounting surface) of the first wafer 61, the conductor patterns 52 are formed. The conductor patterns 52 are formed by, for example, plating the whole area of the other surface of the first wafer 61 with a metal film and thereafter etching the metal film.

Figure 9:
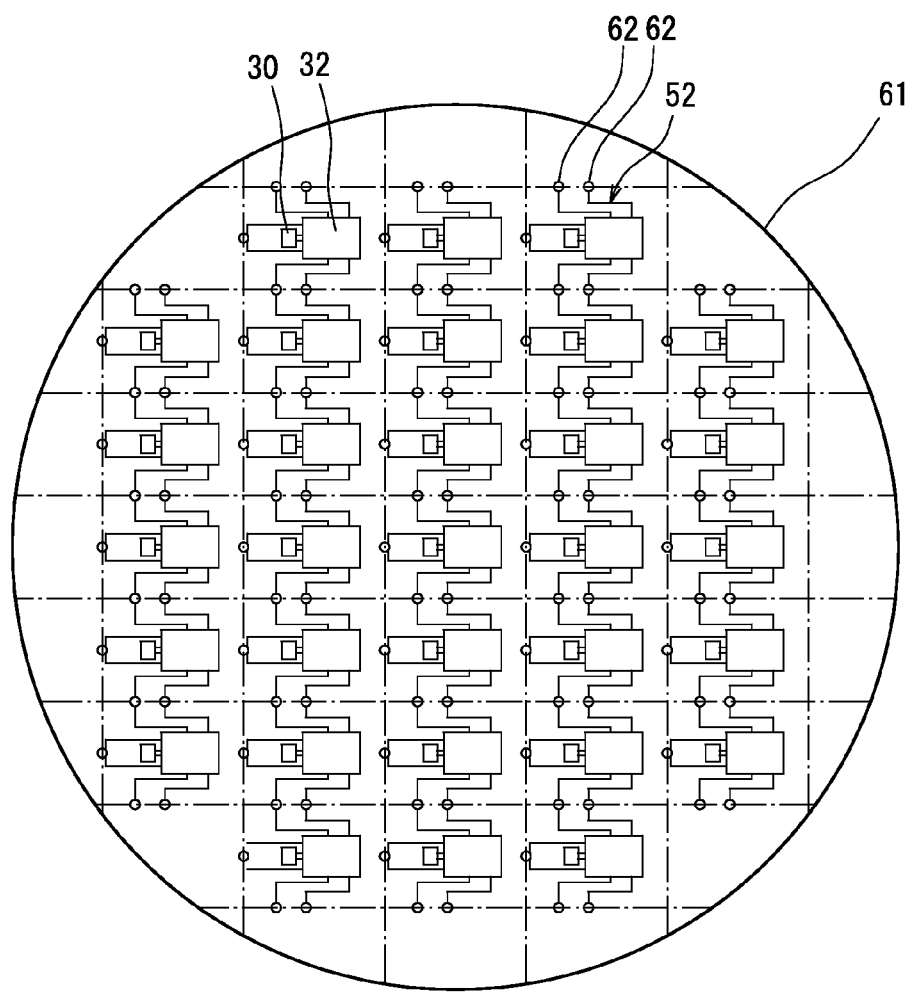
FIG. 9 is a schematic plane view used to explain a mounting step of the photoelectric conversion element and the IC chip in the method of manufacturing the photoelectric conversion module in FIG. 3.

Thereafter, as shown in FIG. 9, on the other surface of the first wafer 61, the photoelectric conversion elements 30 and the IC chips 32 are mounted by, for example, flip-chip mounting (mounting step).

Incidentally, the boring step and the plating step of the through holes 62 may come after the mounting step.

Thereafter, by using a dicing apparatus, the first wafer 61 is cut along cutting lines shown by the dashed lines (dividing step). At the time of this cutting, the plating films are divided into the conductive members 36. When the dividing step is thus finished, semi-finished products of the plural photoelectric conversion modules 24 are obtained.

Finally, after the tip portions of the optical fibers 23 are disposed in the holding grooves 38 of the obtained semi-finished products, the reinforcing members 40 are bonded on the substrates 26 of the semi-finished products with an adhesive, whereby the photoelectric conversion modules 24 are completed.

Incidentally, electrodes similar to the conductive members (electrodes) 36 of the substrate 26 may be provided also on side surfaces of the reinforcing member 40. In this case, the electrodes of the reinforcing members 40 are preferably formed so as to be electrically connected to the electrodes 36 of the substrate 26.

In the photoelectric conversion module 24 of the above-described first embodiment, the concave portions are formed in the side surfaces of the substrate 26, and the conductor pattern 52 is electrically connected to the second motherboard 20 by the conductive members 36 provided on the surfaces of the concave portions. That is, in the photoelectric conversion module 24, the conductive members 36 function as electrodes for external connection, which eliminates a need for forming a circuit pattern with a complicated shape.

The conductive members 36 are sunk deeper than the side surfaces of the substrate 26, and therefore, when the connection parts 50 made of the solder are provided, a mounting area of the photoelectric conversion module 24 on the second motherboard 20 is reduced.

Further, since the conductive members 36 are sunk, contact areas between the conductive members 36 and the connection parts 50 are large and their connection strength is large. Accordingly, this photoelectric conversion module 24 is firmly fixed to the second motherboard 20 and the mobile phone 10 has high reliability.

Further, according to the method of manufacturing the photoelectric conversion module 24 of the above-described first embodiment, since the boring step and the plating step are performed to the first wafer 61, mass production of the photoelectric conversion module 24 is possible. Therefore, the photoelectric conversion module 24 is provided at low cost.

In particular, according to the method of manufacturing the photoelectric conversion module 24 of the above-described first embodiment, by plating the through holes 62, the conductive members 36 are easily formed.

Second Embodiment

Hereinafter, a photoelectric conversion module 64 of a second embodiment will be described. In the description of the second embodiment and the following embodiments, the same structures as those of the foregoing embodiment will be denoted by the same reference numerals and symbols and a description thereof will be omitted.

Figure 10:
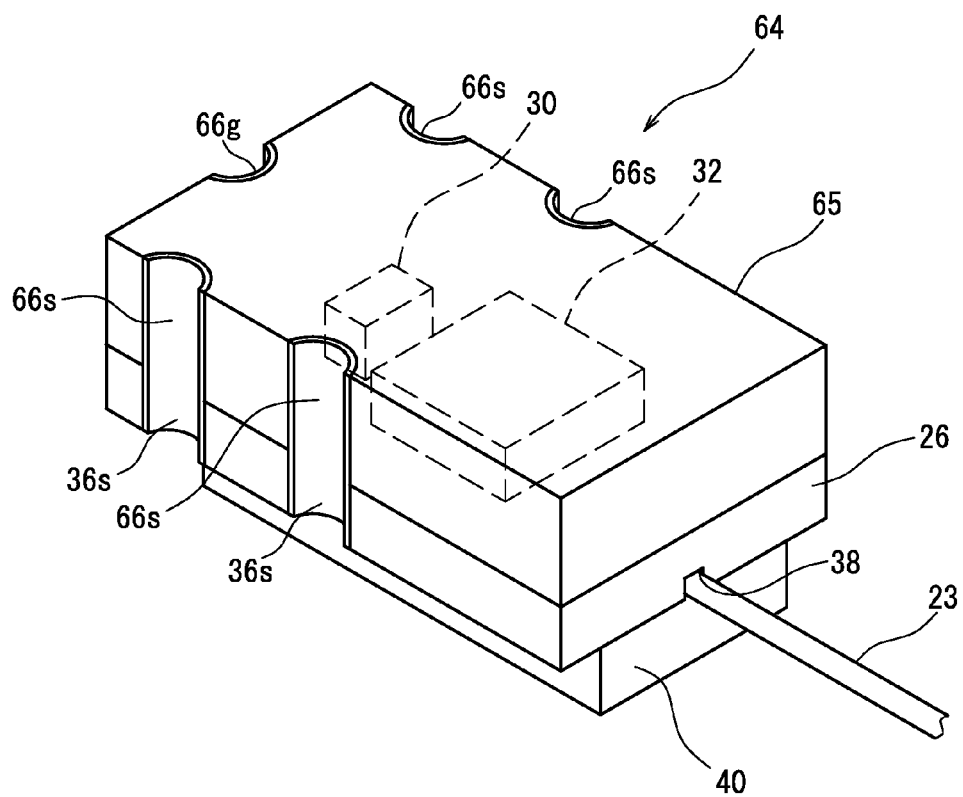
FIG. 10 is a perspective view schematically showing an outer appearance of a photoelectric conversion module of a second embodiment.

FIG. 10 is a perspective view schematically showing the photoelectric conversion module 64 of the second embodiment. A cover member 65 is airtightly fixed to a mounting surface of a substrate 26 so as to cover a photoelectric conversion element 30 and an IC chip 32.

The cover member 65 is made of, for example, one kind selected from a group consisting of glass, silicon, and sapphire. Preferably, a coefficient of linear expansion of the cover member 65 is equal to a coefficient of linear expansion of the substrate 26, and for this purpose, the cover member 65 and the substrate 26 are made of the same material.

In this embodiment, for example, the cover member 65 is made of glass, and a thickness of the cover member 65 falls within a range of not less than 400 μm nor more than 1500 μm, and an area of a surface, of the cover member 65, facing the mounting surface of the substrate 26 is substantially equal to that of the mounting surface of the substrate 26.

A plurality of concave portions extending from end to end of the is cover member 65 in its thickness direction are formed in side surfaces of the cover member 65, and on the whole areas of surfaces of the concave portions, filmy conductive members (second electrodes) 66 having conductivity are formed. The conductive members 66 each have a concave shape sunk deeper than portions, of the side surfaces of the cover member 65, located on both sides of the conductive members 66. Concave portions of the substrate 26 and the concave portions of the cover member 65 continue from each other and the conductive members 66 continue integrally with conductive members 36.

Note that the conductive members 36, 66 include ground electrodes 36g, 66g and electrodes for signal or power supply (signal/power supply electrodes) 36s, 66s.

Figure 11:
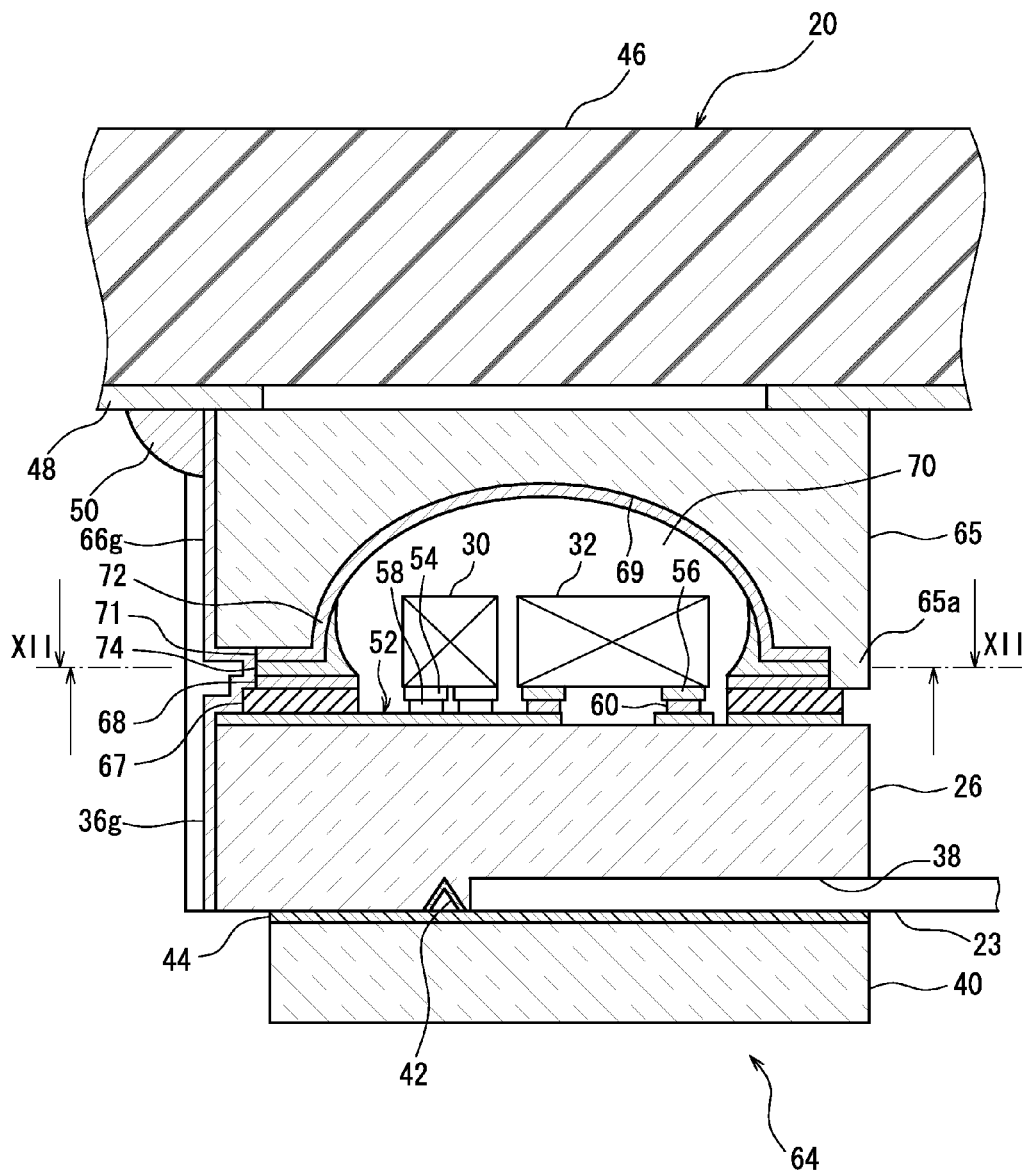
FIG. 11 is a schematic cross-sectional view of the photoelectric conversion module attached to the second motherboard.

FIG. 11 is a schematic cross-sectional view of the photoelectric conversion module 64 mounted on the second motherboard 20.

The photoelectric conversion module 64 is disposed so that the cover member 65 faces the second motherboard 20, and connection parts 50 are connected to the conductive members 66. In the second embodiment, the depression 49 need not be formed in the second motherboard 20.

On the mounting surface of the substrate 26, an insulating layer 67 is provided along its outer edge. The insulating layer 67 has a frame shape and surrounds the photoelectric conversion element 30 and the IC chip 32. The insulating layer 67 covers portions, of the conductor pattern 52, intersecting with itself. For example, the insulating layer 67 has a thickness within a range of not less than 0.1 μm nor more than 100 μm and a width within a range of nor less than 50 μm nor more than 300 μm.

The insulating layer 67 is made of, for example, a nonconductive substance such as silicon oxide or aluminum oxide and is formed by physical vapor deposition or chemical vapor deposition.

On the insulating layer 67, a substrate-side base film 68 is formed. The substrate-side base film 68 has a frame shape and has affinity or wettability to solder. In other words, solder has an adhesive property to the substrate-side base film 68. The substrate-side base film 68 is made of, for example, a film of a single metal selected from a group consisting of Au, Cu, and Cr or an alloy thereof, or made of a laminate of these films.

The cover member 65 has a depression 69 at a center of its surface (facing surface) facing the mounting surface of the substrate 26. Preferably, in a wall surface of the depression 69, an area near an opening edge is inclined relative to the mounting surface. Concretely, the wall surface of the depression 69 is a curved surface and has a bowl shape or a mortar shape.

The wall surface of the depression 69 cooperatively with the mounting surface defines a chamber (housing chamber) 70 for housing the photoelectric conversion element 30 and the IC chip 32. The depression 69 is formed by, for example, sandblasting.

The depression 69 is opened in the facing surface of the cover member 65 and the facing surface has a frame-shaped junction area around the opening of the depression 69. On the junction area of the cover member 65, a cover-side base film 71 is formed. The cover-side base film 71 has a frame shape and has affinity or wettability to solder. The cover-side base film 71 is made of, for example, a film of a single metal selected from a group consisting of Au, Cu, and Cr or an alloy thereof, or made of a laminate of these films.

Further, on the wall surface of the depression 69, a solder adsorbing film 72 integrally continuing from an inner edge of the cover-side base film 71 is formed, as a preferable form. More preferably, the solder adsorbing film 72 is formed on the whole area of the wall surface of the depression 69. The solder adsorbing film 72 has affinity or wettability to solder and preferably has conductivity. The solder adsorbing film 72 is made of, for example, a film of a single metal selected from a group consisting of Au, Cu, and Cr or an alloy thereof, or made of a laminate of these films. The solder adsorbing film 72 can be formed by physical vapor deposition or chemical vapor deposition, for example, at the same time when the cover-side base film 71 is formed.

The substrate-side base film 68 is disposed to face the cover-side base film 71. Preferably, the substrate-side base film 68 extends toward a more inner side of the housing chamber 70 than the cover-side base film 71. The substrate-side base film 68 and the cover-side base film 71 are airtightly connected to each other via a solder layer 74 constituted by solder. The solder is, for example, an Au—Sn alloy or an Sn—Ag alloy.

Therefore, the housing chamber 70 is an airtight chamber, and the housing chamber 70 is filled with dry gas, preferably inert gas. The inert gas is, for example, rare gas such as He or nitrogen gas. Alternatively, the housing chamber 70 may be vacuum or pressure-reduced.

Figure 12:
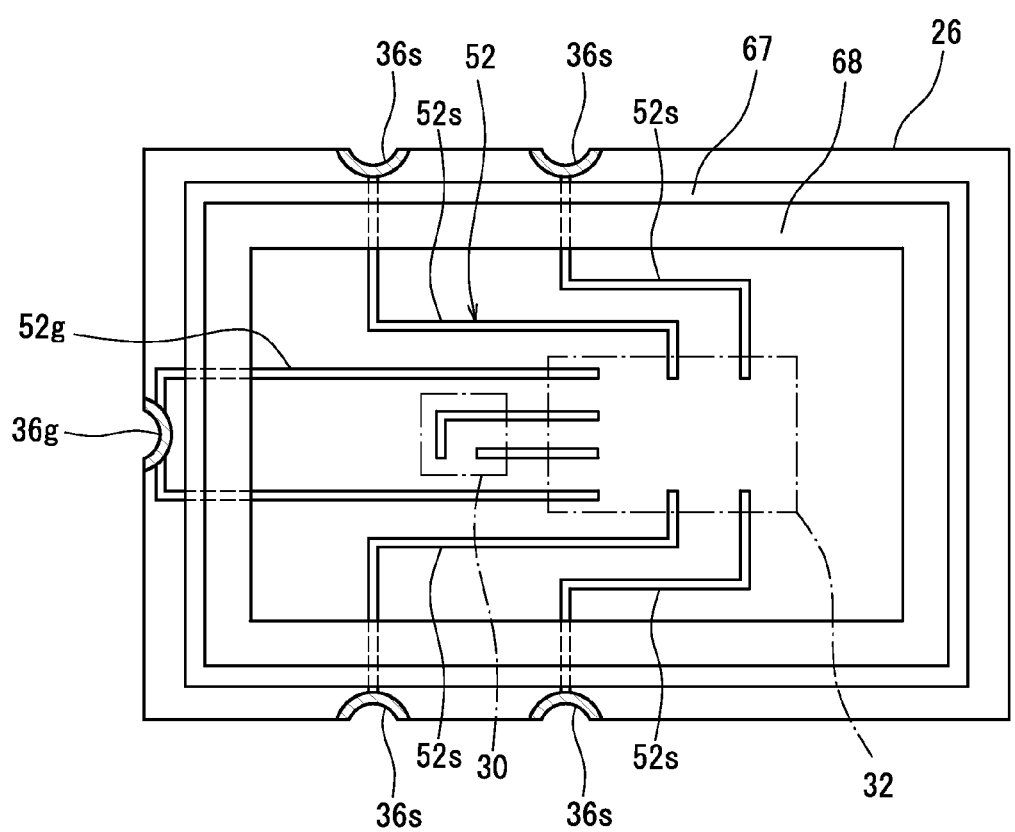
FIG. 12 is a plane view schematically showing a mounting surface of a substrate of the photoelectric conversion module taken along the XII-XII line in FIG. 11, with a solder layer, a photoelectric conversion element, and an IC chip being removed.

FIG. 12 is a plane view schematically showing the mounting surface of the substrate 26 of the photoelectric conversion module 64 taken along the XII-XII line in FIG. 11, with the solder layer 74, the photoelectric conversion element 30, and the IC chip 32 being removed. As shown in FIG. 12, an outer edge of the substrate-side base film 68 is located on a more inner side than an outer edge of the insulating layer 67.

The conductor pattern 52 provided on the mounting surface includes a ground line 52g connected to the ground electrodes 36g, 66g and signal/power supply lines 52s connected to the signal/power supply electrodes 36s, 66s. The ground line 52g and the signal/power supply lines 52s all extend to cross the insulating layer 67.

Figure 13:
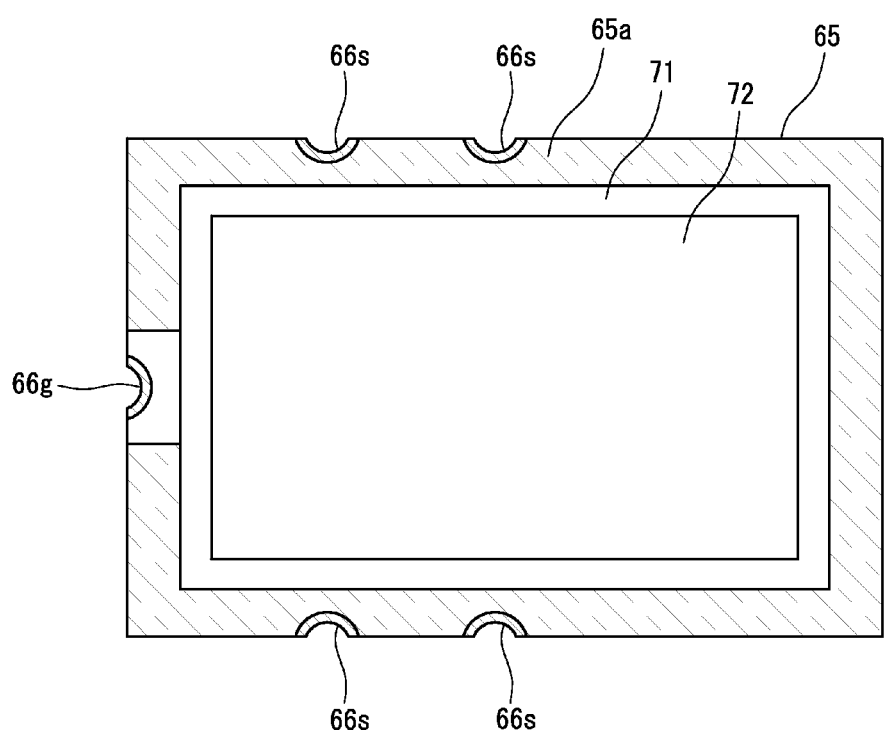
FIG. 13 is a plane view schematically showing a facing surface, of a cover member, facing the mounting surface of the substrate of the photoelectric conversion module taken along the XII-XII line in FIG. 11, with the solder layer being removed.

FIG. 13 is a plane view schematically showing the facing surface, of the cover member 65, facing the mounting surface of the substrate 26 of the photoelectric conversion module 64 taken along the XII-XII line in FIG. 11, with the solder layer 74 being removed.

The cover-side base film 71 is provided on an area facing the substrate-side base film 64 and is located on a more inner side than the outer edge of the insulating layer 67. The cover member 65 has a frame-shaped projection 65a that protrudes toward the substrate 26 from the outer edge of the facing surface so as to surround the cover-side base film 71. Accordingly, in the cover member 65, the cover-side base film 71 is provided in a flat frame-shaped area present between the projection 65a and the depression 69.

In this embodiment, as a preferable form, the solder adsorbing film 72 is formed on the whole area of the wall surface of the depression 69 and is also grounded. Therefore, the projection 65a is not provided near the ground electrode 66g.

Figure 14:
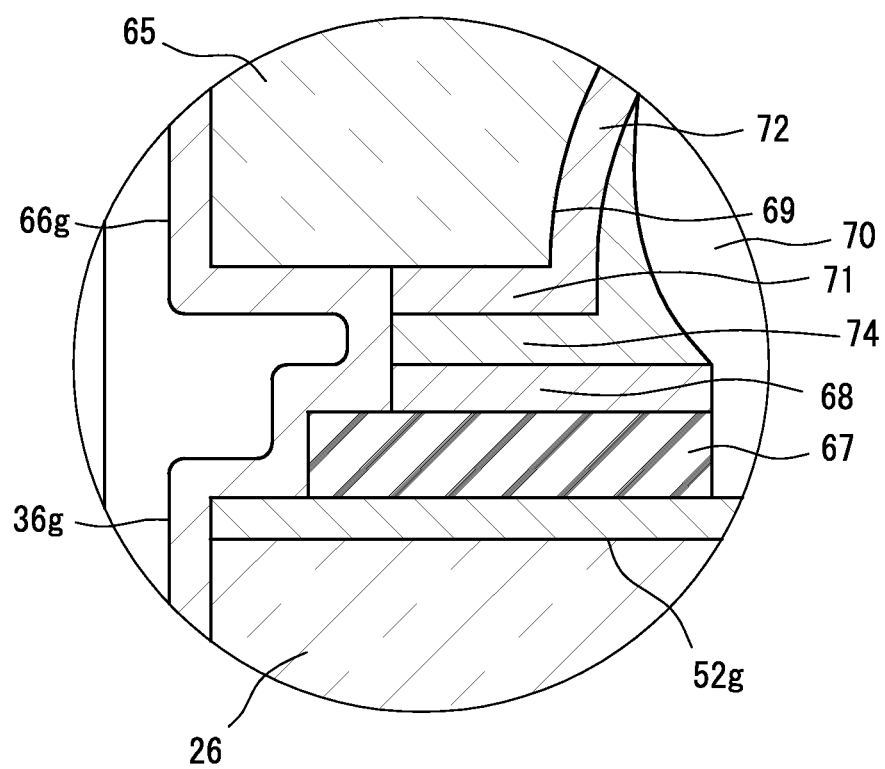
FIG. 14 is an enlarged cross-sectional view schematically showing a junction area between the substrate and the cover member, used to explain a connection structure between a solder adsorbing film and a ground electrode in the photoelectric conversion module in FIG. 10.

FIG. 14 is an enlarged cross-sectional view schematically showing the junction area between the substrate 26 and the cover member 65, used to explain a connection structure between the ground electrodes 36g, 66g and the cover-side base film 71. As shown in FIG. 14, the ground electrodes 36g, 66g are connected to ends of the cover-side base film 71, the solder layer 74, and the substrate-side base film 68.

Figure 15:
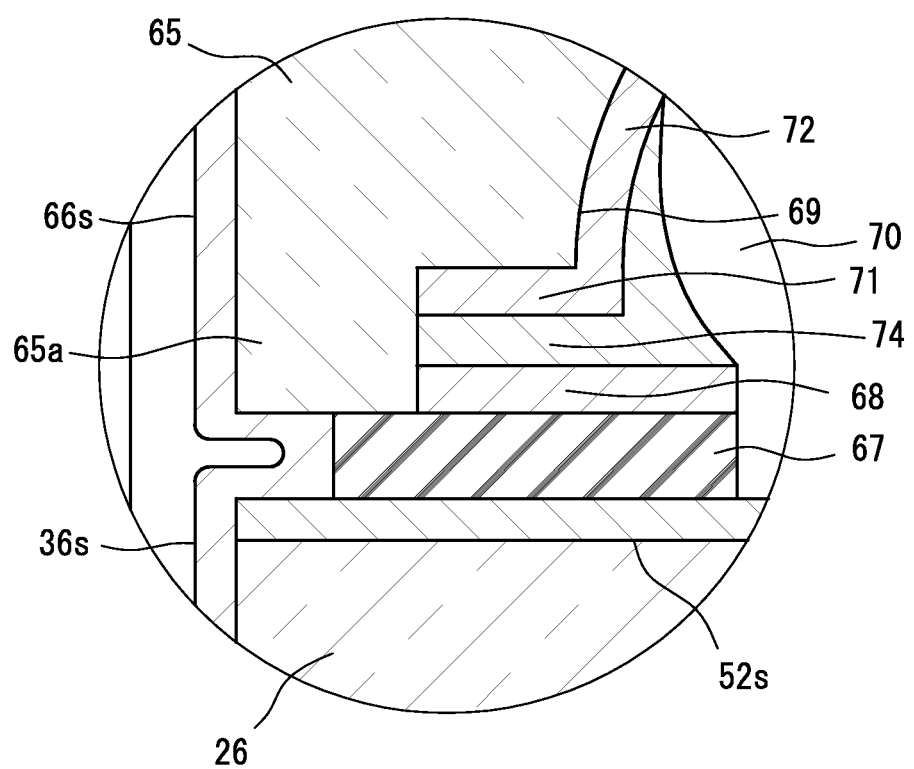
FIG. 15 is an enlarged cross-sectional view schematically showing the junction area between the substrate and the cover member, used to explain a connection structure between a signal/power supply line of a conductor pattern and a signal/power supply electrode in the photoelectric conversion module in FIG. 10.

FIG. 15 is an enlarged cross-sectional view schematically showing the junction area between the substrate 26 and the cover member 65, used to explain a connection structure between the signal/power supply electrodes 36s, 66s and the signal/power supply line 52s. As shown in FIG. 15, the signal/power supply electrodes 36s, 66s are connected to an end portion of the signal/power supply line 52s extending from the insulating layer 67. On the other hand, the projection 65a and the insulating layer 67 are present between the signal/power supply electrodes 36s, 66s, and the cover-side base film 71, the solder film 74 and the substrate-side base film 68 to prevent the direct contact therebetween.

Hereinafter, a preferable method of manufacturing the above-described photoelectric conversion module 64 will be described.

Figure 16:
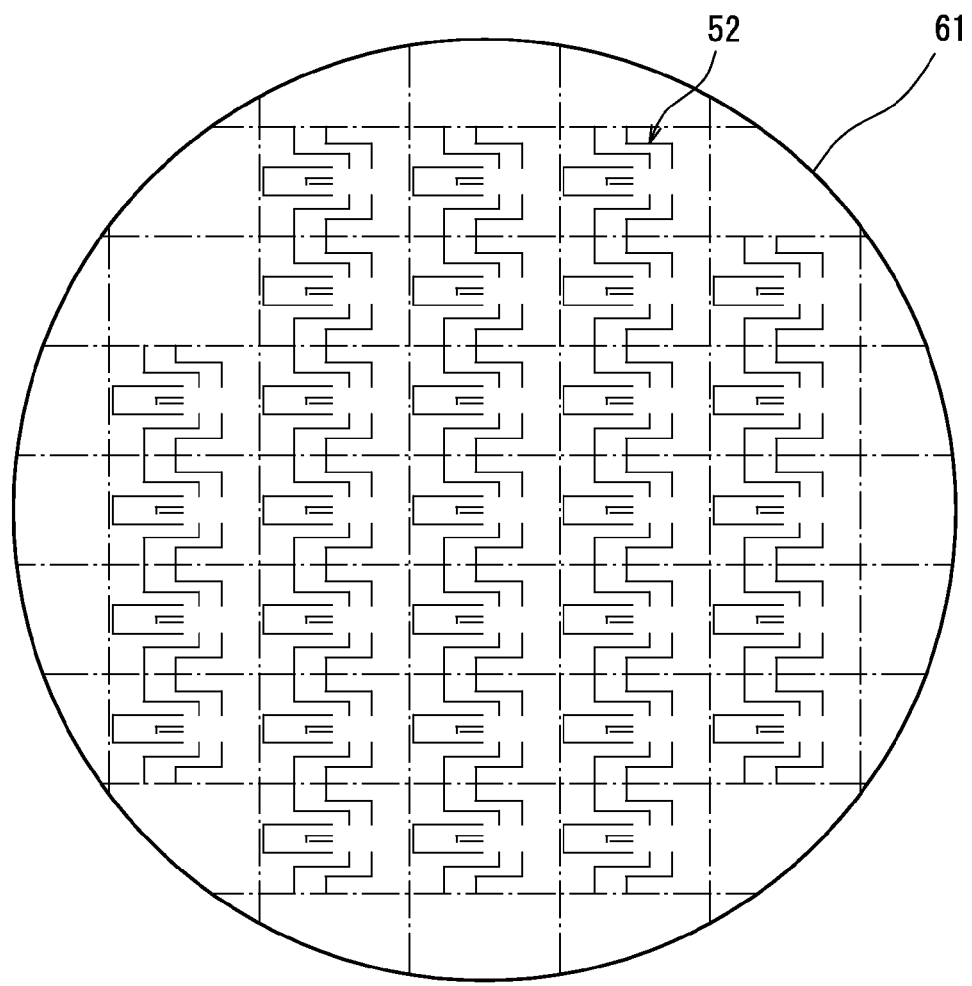
FIG. 16 is a schematic plane view used to explain a forming step of the conductor pattern in the method of manufacturing the photoelectric conversion module in FIG. 10.

Processes up to the formation of the holding grooves 38 and the mirrors 42 on one surface of the first wafer 61 are the same as those of the first embodiment (see FIG. 6), but in the second embodiment, after the holding groove/mirror forming step, the conductor patterns 52 are formed on the other surface of the first wafer 61 as shown in FIG. 16.

Figure 17:
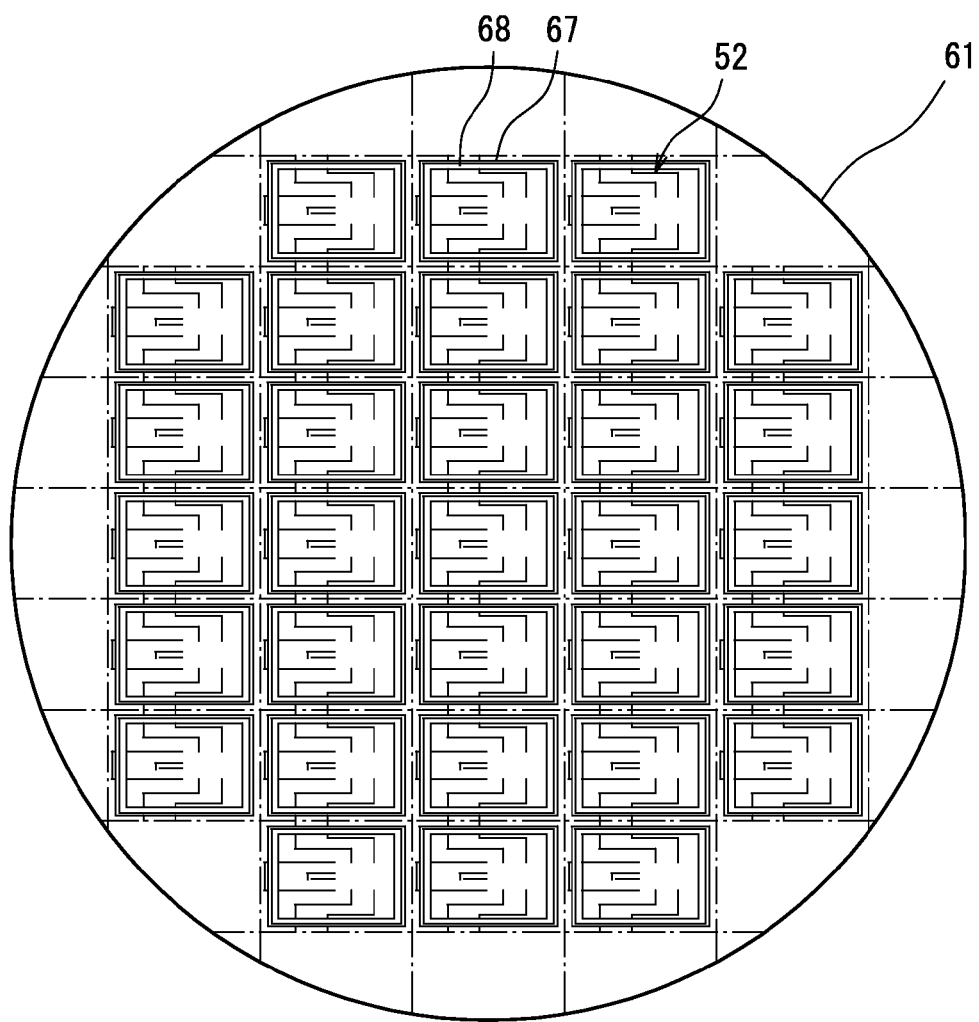
FIG. 17 is a schematic plane view used to explain a film forming step of an insulating layer and a substrate-side base film in the method of manufacturing the photoelectric conversion module in FIG. 10.

Next, as shown in FIG. 17, on the other surface of the first wafer 61, the insulating layers 67 are formed and further the substrate-side base films 68 are formed on the insulating layers 67. The insulating layers 67 can be formed by, for example, covering areas except areas where to form them by a mask, followed by physical vapor deposition or chemical vapor deposition.

Further, the substrate-side base films 68 can be formed by covering areas except areas where to form them by a mask, followed by electroless plating or electrolytic plating or followed by physical vapor deposition or chemical vapor deposition.

Figure 18:
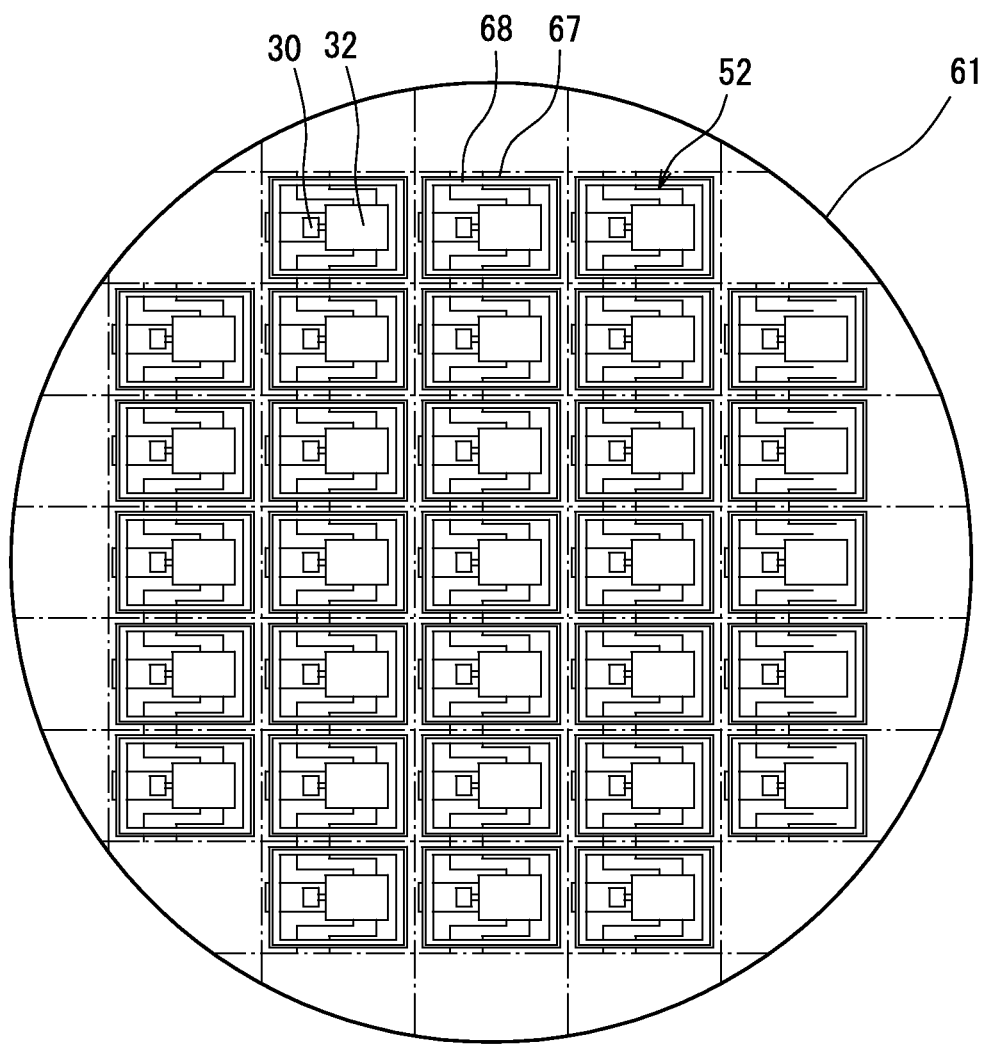
FIG. 18 is a schematic plane view used to explain a mounting step of the photoelectric conversion element and the IC chip in the method of manufacturing the photoelectric conversion module in FIG. 10.

Thereafter, as shown in FIG. 18, on the other surface of the first wafer 61, the photoelectric conversion elements 30 and the IC chips 32 are mounted by, for example, flip-chip mounting (mounting step).

Figure 19:
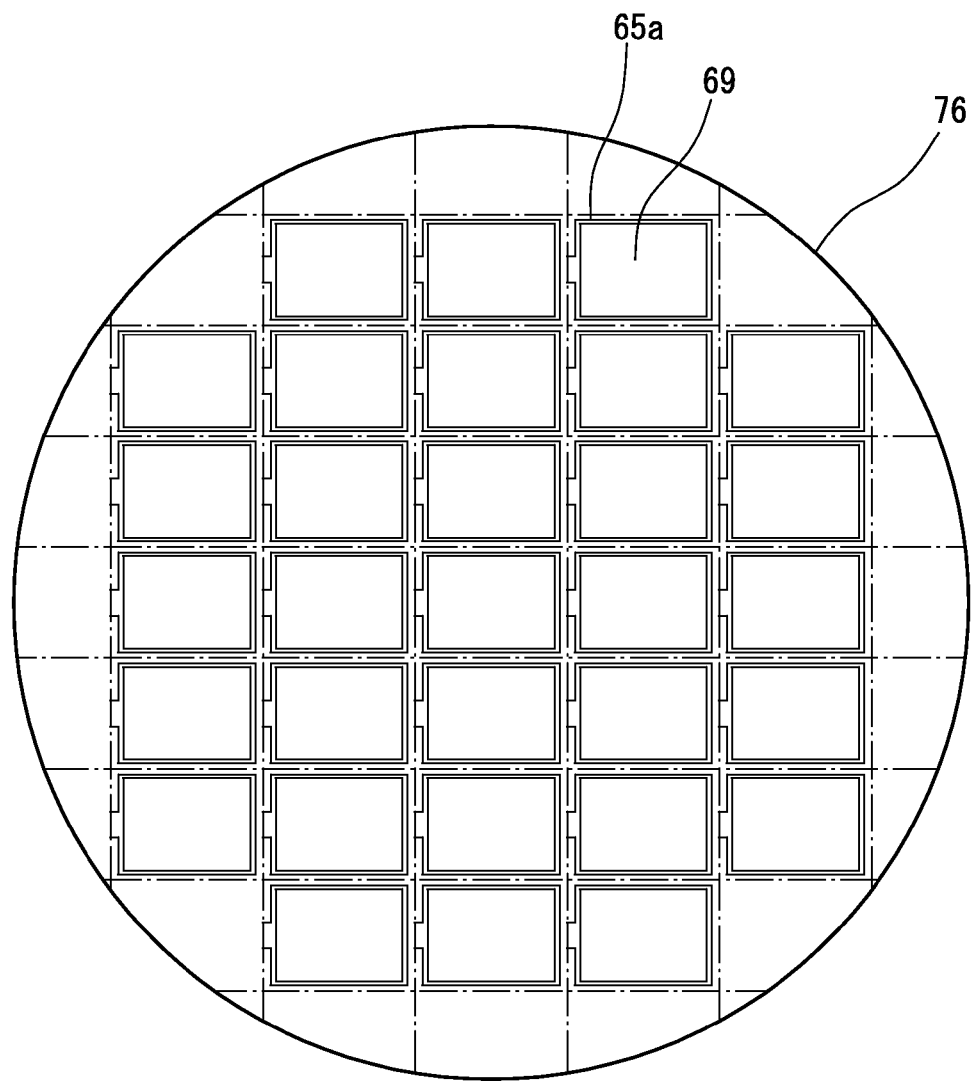
FIG. 19 is a schematic plane view used to explain a forming step of a projection and a depression of the cover member in the method of manufacturing the photoelectric conversion module in FIG. 10.

Meanwhile, as shown in FIG. 19, as a material of the cover member 65, a second wafer 76 is prepared. Then, on one surface of the second wafer 76, the projections 65a and the depressions 69 are formed by, for example, sandblasting.

Figure 20:
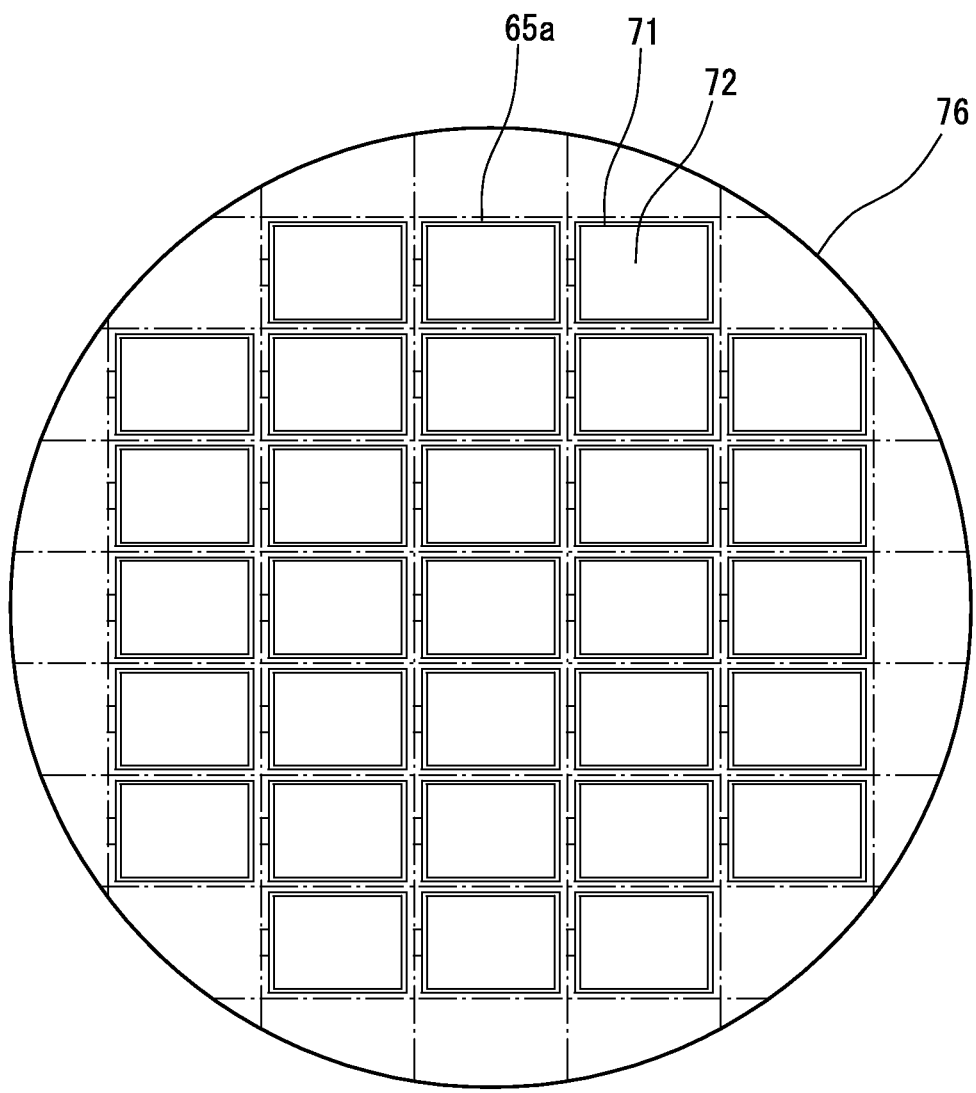
FIG. 20 is a schematic plane view used to explain a film forming step of a cover-side base film and the solder adsorbing film in the method of manufacturing the photoelectric conversion module in FIG. 10.

Next, as shown in FIG. 20, on the one surface of the second wafer 76, the cover-side base films 71 and the solder adsorbing films 72 are formed (film forming step). The cover-side base films 71 and the solder adsorbing films 72 can be formed by, for example, covering areas except areas where to form them by a mask, followed by electroless plating or electrolytic plating, or followed by physical vapor deposition or chemical vapor deposition.

Then, the solder to become the solder layers 74 is applied on the cover-side base films 71. At this time, the applied solder may be in a linear shape or may be in a ball shape.

Thereafter, under an inert gas atmosphere, the second wafer 76 on which the solder is applied is stacked on the first wafer 61 on which the photoelectric conversion elements 30 and the IC chips 32 are mounted, then they are heated, whereby the first wafer 61 and the second wafer 76 are joined by the solder (joining step). At the time of this joining, the solder forms the solder layers 74.

Figure 21:
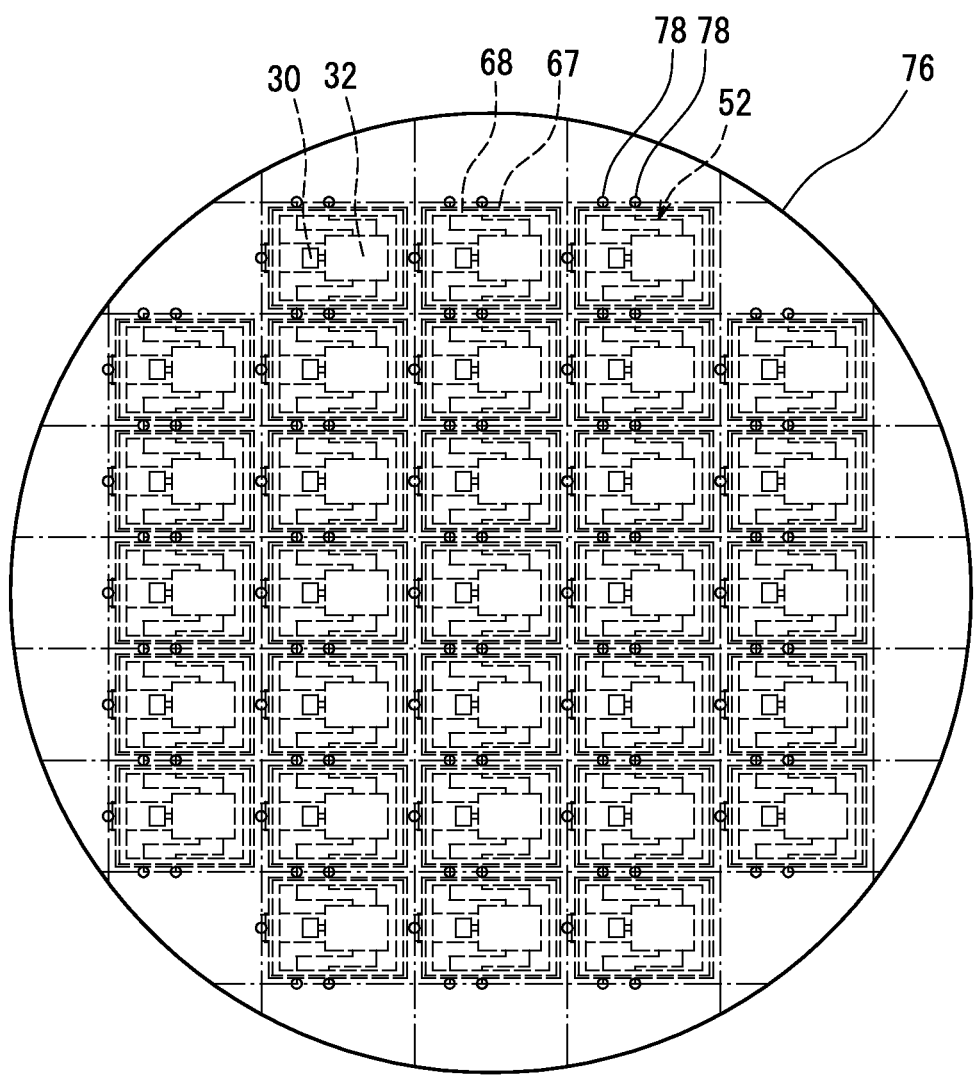
FIG. 21 is a schematic plane view used to explain a boring step of through holes in the method of manufacturing the photoelectric conversion module in FIG. 10.

Next, as shown in FIG. 21, through holes 78 penetrating through the first wafer 61 and the second wafer 76 are formed by, for example, drilling, sandblasting, etching, or the like, preferably by drilling (boring step). Then, on wall surfaces of the through holes 78, electroless plating or electrolytic plating is applied to form the plating films (plating step).

Thereafter, by using a dicing apparatus, the first wafer 61 and the second wafer 76 joined with each other are cut along cutting lines shown by the dashed lines (dividing step). Consequently, the plating films are cut to form the conductive members 36, 66 and semi-finished products of the plural photoelectric conversion modules 64 are obtained.

Finally, after the tip portions of the optical fibers 23 are disposed in the holding grooves 38 of the obtained semi-finished products, the reinforcing members 40 are bonded on the substrates 26 of the semi-finished products with an adhesive, whereby the photoelectric conversion modules 64 are completed.

In the photoelectric conversion module 64 of the above-described second embodiment, the cover member 65 is fixed to the substrate 26, and the substrate 26 and the cover member 65 form the airtight housing chamber 70. The housing chamber 70 is filled with dry gas and the photoelectric is conversion element 30 is protected from moisture. Therefore, this photoelectric conversion element 30 has a long life, and the photoelectric conversion module 64 has high reliability.

In the photoelectric conversion module 64 of the above-described second embodiment, the concave portions are formed in the side surfaces of the substrate 26 and the cover member 65, and the conductor pattern 52 is electrically connected to the second motherboard 20 by the conductive members 66 provided on the surfaces of the concave portions. That is, in the photoelectric conversion module 64, the conductive members 66 function as electrodes for external connection, which eliminates a need for forming a circuit pattern with a complicated shape on the cover member 65.

Since the conductive members 66 are sunk deeper than the side surfaces of the substrate 26 and the cover member 65, the mounting area of the photoelectric conversion module 64 on the second motherboard 20 is reduced when the connection parts 50 made of solder are provided.

Further, since the conductive members 66 are sunk, the contact area between the conductive members 66 and the connection parts 50 is large and their connection strength is large. Therefore, this photoelectric conversion module 64 is firmly fixed to the second motherboard 20 and the mobile phone 10 has high reliability.

Further, according to the method of manufacturing the photoelectric conversion module 64 of the above-described second embodiment, since the boring step and the plating step are performed to the first wafer 61 and the second wafer 76, mass production of the photoelectric conversion module 64 is possible. Therefore, the photoelectric conversion module 64 is provided at low cost.

In particular, according to the method of manufacturing the photoelectric conversion module 64 of the above-described embodiment, by plating the through holes 78, the conductive members 36, 66 are easily formed.

Third Embodiment

Figure 22:
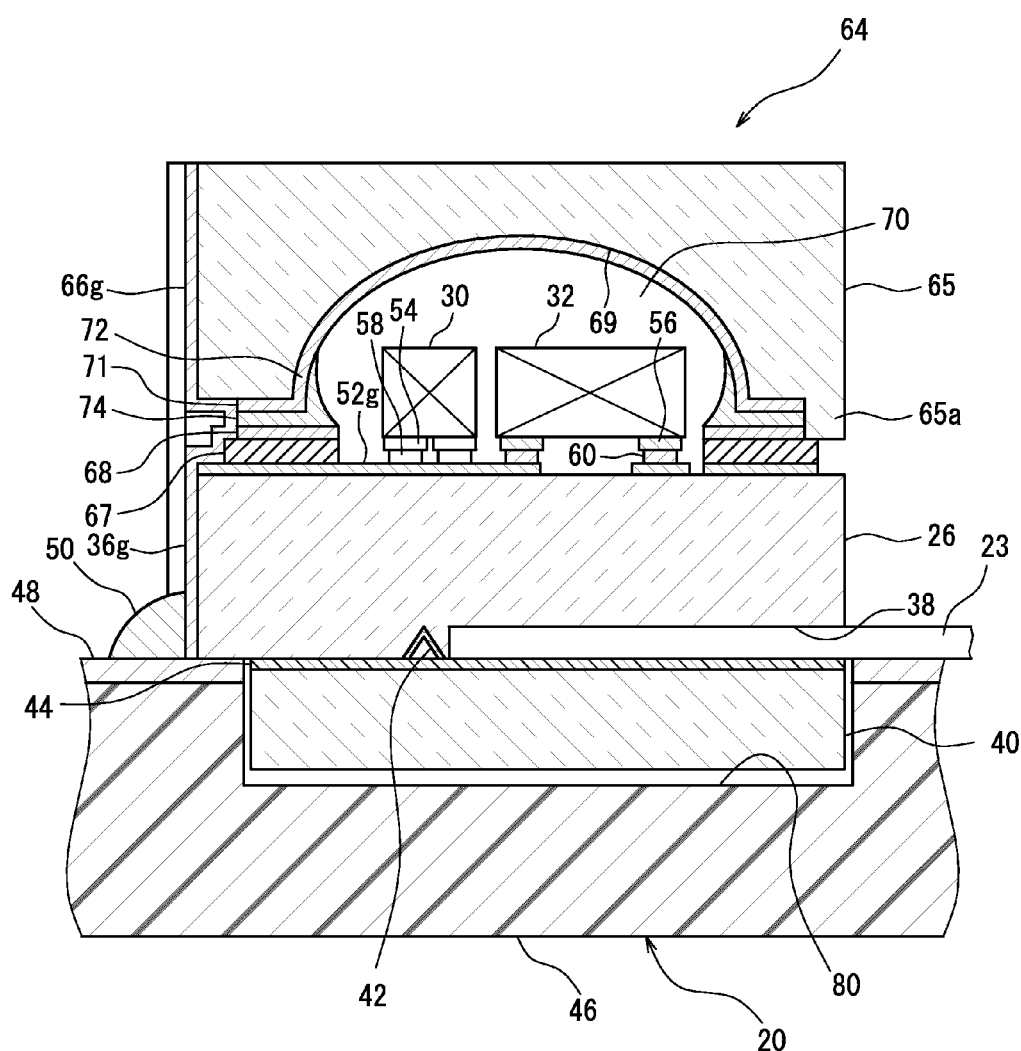
FIG. 22 is a schematic cross-sectional view used to explain another mounting method of the photoelectric conversion module in FIG. 10 on the second motherboard, as a third embodiment.

Hereinafter, a third embodiment will be described with reference to FIG. 22.

The third embodiment is different from the second embodiment only in that the substrate 26 side of the photoelectric conversion module 64 is fixed to the second motherboard 20. In this case, in the second motherboard 20, a hole, a cutout, a U-groove, or the like is provided as a depression 80 receiving the reinforcing member 40.

In the third embodiment, the same effects as those of the second embodiment can be obtained.

Fourth Embodiment

Figure 23:
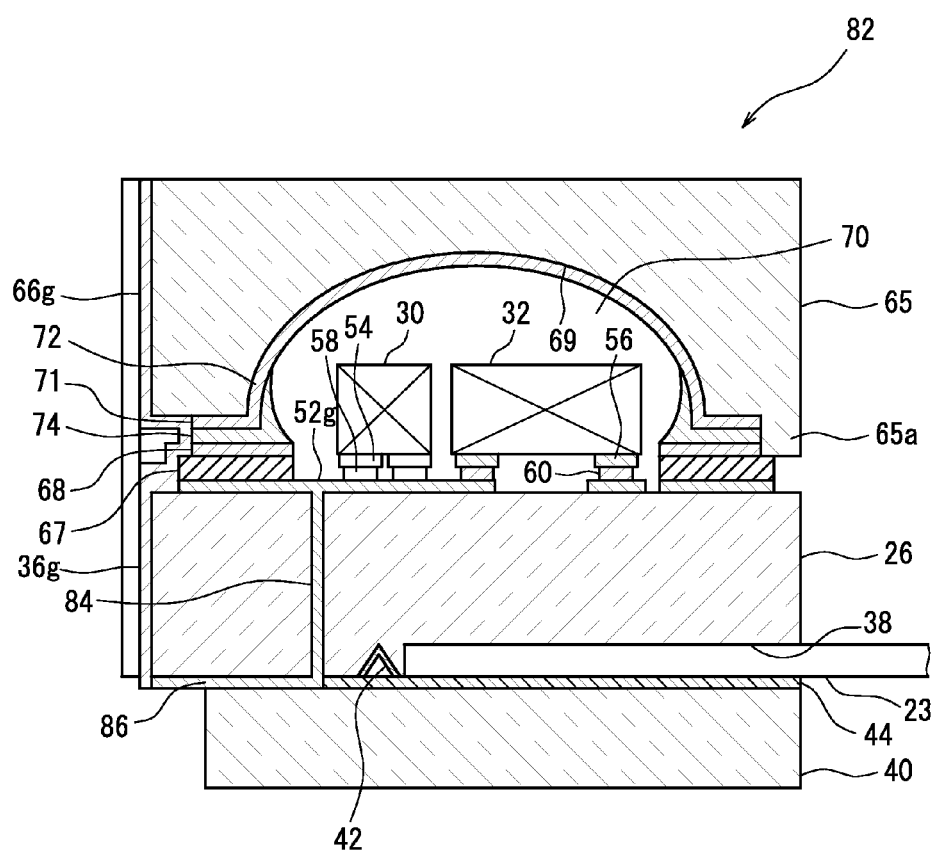
FIG. 23 is a schematic cross-sectional view of a photoelectric conversion module of a fourth embodiment.

Hereinafter, a photoelectric conversion module 82 of a fourth embodiment will be described with reference to FIG. 23.

In the photoelectric conversion module 64 of the above-described second embodiment, the conductor pattern 52 is connected to the conductive members 36 at the end of the mounting surface, but the conductor pattern 52 may be connected to the conductive members 36 in another route as in the photoelectric conversion module 82. Concretely, as the other route, through holes may be provided in the substrate 26, and through hole conductors 84 filled in the through holes and another conductor pattern 86 provided on the rear surface of the substrate 26 may be provided. The through holes, the through hole conductors 84, and the conductor pattern 86 are formed prior to the mounting step.

In the fourth embodiment, the same effects as those of the second embodiment can be obtained.

Fifth Embodiment

Figure 24:
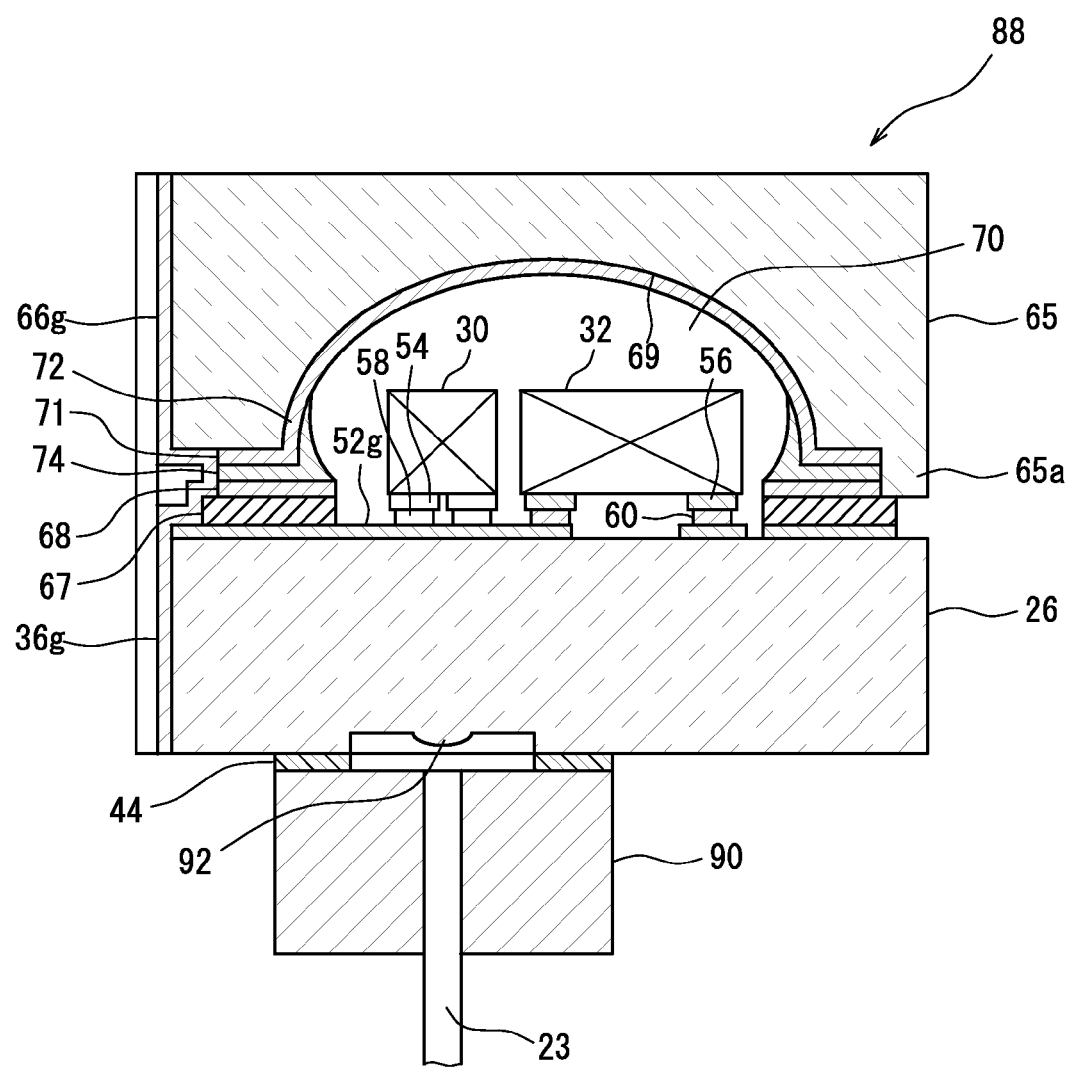
FIG. 24 is a schematic cross-sectional view of a photoelectric conversion module of a fifth embodiment.

Hereinafter, a photoelectric conversion module 88 of a fifth embodiment will be described with reference to FIG. 24.

In the photoelectric conversion module 64 of the above-described second embodiment, as a preferable form, the tip portion of the optical fiber 23 is fixed in the holding groove 38 in the rear surface of the substrate 26, but it may be fixed by another fixing means.

For example, as in the photoelectric conversion module 88, the tip portion of the optical fiber 23 may be fixed perpendicularly to the rear surface of the substrate 26 so that an optical axis of the photoelectric conversion element 30 and an optical axis of the optical fiber 23 coincide with each other.

In this case, a ferule 90 fixing the tip portion of the optical fiber 23 is fixed to the rear surface of the substrate 26 by an adhesive layer 44. Then, when necessary, a lens 92 is provided between the photoelectric conversion element 30 and the optical fiber 23. Preferably, the lens 92 is formed integrally on the rear surface of the substrate 26. A forming step of the lens 92 can be performed in place of, for example, the forming step of the mirror 42.

In the fifth embodiment, the same effects as those of the second embodiment can be obtained.

Sixth Embodiment

Figure 25:
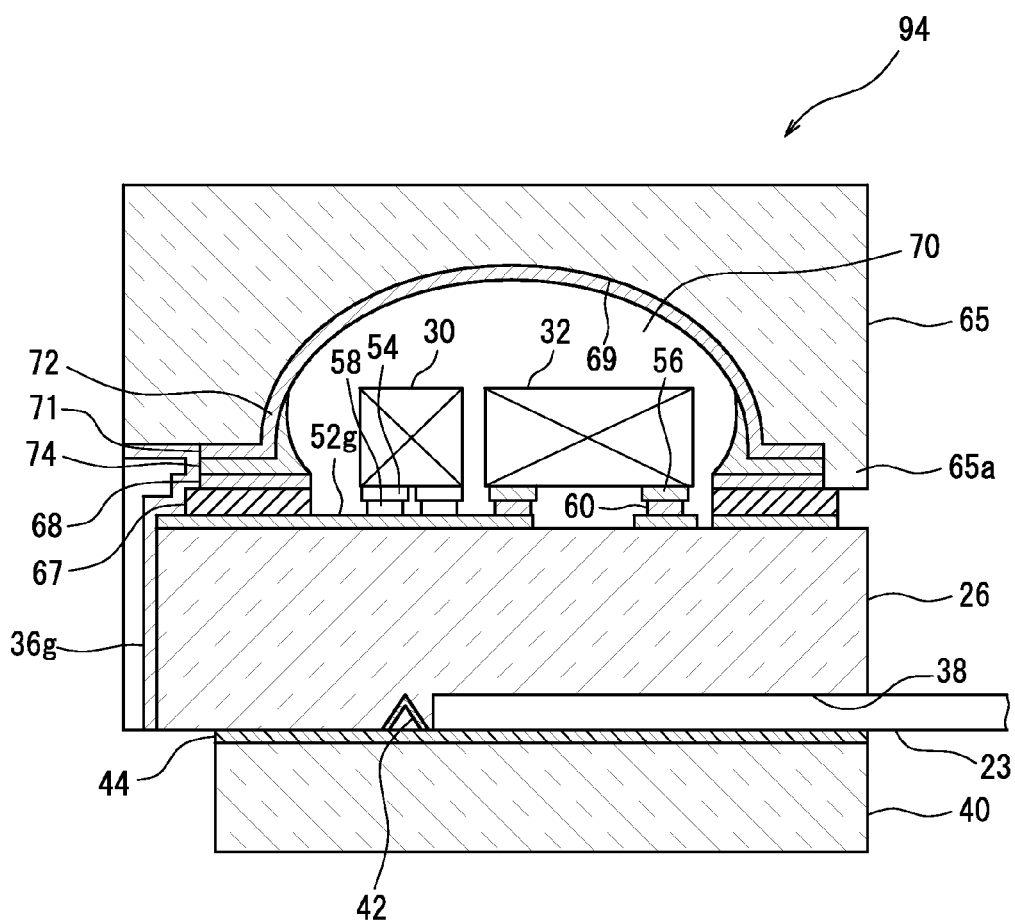
FIG. 25 is a schematic cross-sectional view of a photoelectric conversion module of a sixth embodiment.

Hereinafter, a photoelectric conversion module 94 of a sixth embodiment will be described with reference to FIG. 25.

In the photoelectric conversion module 64 of the above-described second embodiment, as a preferable form, the concave portions are also formed in the side surfaces of the cover member 65, and the conductive members 36 cover the concave portions of the cover member 65, but as in the photoelectric conversion module 94, the conductive members 36 may be provided only on the surfaces of the concave portions in the side surfaces of the substrate 26, without the concave portions on the cover member 65 side being provided.

In this case, the boring step and the plating step come before the joining step of the first wafer 61 and the second wafer 76.

In the sixth embodiment, the same effects as those of the first embodiment can be obtained.

As described hitherto, according to the present invention, there is provided a photoelectric conversion module having electrodes for external connection with a simple structure and a method of manufacturing the photoelectric conversion module.

The present invention is not limited to the above-described first to sixth embodiments, and includes embodiments where two or more of the first to sixth embodiments are appropriately combined and embodiments where changes are made in these embodiments.

Finally, the optical wiring including the photoelectric conversion module of the present invention is applicable to information processing devices other than mobile phones, network devices, digital AV devices, and home electric appliances. More specifically, the photoelectric conversion module is also applicable to, for example, a personal computer, a switching hub, a HDMI (trademark: High Definition Multimedia Interface) cable, and so on.

EXPLANATION OF NUMERALS AND SYMBOLS 20 second motherboard
22 optical wiring
23 optical fiber
24 photoelectric conversion module
26 substrate
30 photoelectric conversion element
32 IC chip
36 conductive member (electrode)
38 holding groove
40 reinforcing member
52 conductor pattern
65 cover member
66 conductive member (second electrode)
67 insulating layer
70 housing chamber (airtight chamber)
72 solder adsorbing film
74 solder layer

What is claimed is:

1. A photoelectric conversion module comprising:
    a substrate having a light transmitting property and having a mounting surface;
    a photoelectric conversion element and an IC chip mounted on the mounting surface of said substrate;
    a first electrode provided on a side surface of said substrate, electrically connected to said IC chip, and having a concave shape sunk deeper than other portions of the side surface;
    an insulating layer provided along an outer edge of the mounting surface of said substrate;
    a substrate-side base film formed on said insulating layer;
    a cover member fixed to said substrate and forming, cooperatively with said substrate, an airtight chamber housing said photoelectric conversion element;
    a cover-side base film formed on a junction area of said cover member with said substrate-side base film; and
    a second electrode provided on a side surface of said cover member, continuing from said first electrode, and having a concave shape sunk deeper than other portions of the side surface of said cover member,
    wherein said cover member has a projection that protrudes toward said substrate so as to surround said cover-side base film except at a vicinity of a ground electrode of said second electrode, and
    wherein said cover-side base film is electrically connected to a ground electrode of said first electrode and to the ground electrode of said second electrode.

2. The photoelectric conversion module according to claim 1, wherein said first electrode is formed in such a manner that, after a conductive film is applied on a wall surface of a through hole formed in a first wafer that is to be divided into a plurality of substrates, the first wafer is cut at a position passing on the through hole and the conductive film is cut.

3. The photoelectric conversion module according to claim 2, wherein the conductive film includes a gold plating film on a surface layer.

4. The photoelectric conversion module according to claim 3, wherein:
    said substrate has a holding groove in a rear surface opposite the mounting surface; and
    a tip portion of an optical fiber is fixed in the holding groove, and the module further comprising:
    a mirror optically coupling the optical fiber and said photoelectric conversion element; and
    a reinforcing member fixed to the rear surface of said substrate and holding, with said substrate, the tip portion of the optical fiber.

5. The photoelectric conversion module according to claim 4, wherein said reinforcing member has a surface fixed to said substrate and smaller in area than the rear surface of said substrate.

6. The photoelectric conversion module according to claim 2, wherein:
    said substrate has a holding groove in a rear surface opposite the mounting surface; and
    a tip portion of an optical fiber is fixed in the holding groove, and the module further comprising:
    a mirror optically coupling the optical fiber and said photoelectric conversion element; and
    a reinforcing member fixed to the rear surface of said substrate and holding, with said substrate, the tip portion of the optical fiber.

7. The photoelectric conversion module according to claim 6, wherein said reinforcing member has a surface fixed to said substrate and smaller in area than the rear surface of said substrate.

8. The photoelectric conversion module according to claim 1, wherein:
    said substrate has a holding groove in a rear surface opposite the mounting surface; and
    a tip portion of an optical fiber is fixed in the holding groove, and the module further comprising:
    a mirror optically coupling the optical fiber and said photoelectric conversion element; and
    a reinforcing member fixed to the rear surface of said substrate and holding, with said substrate, the tip portion of the optical fiber.

9. The photoelectric conversion module according to claim 8, wherein said reinforcing member has a surface fixed to said substrate and smaller in area than the rear surface of said substrate.

10. The photoelectric conversion module according to claim 1, wherein said cover member has, in a surface facing the mounting surface, a depression forming the airtight chamber, and wherein on a wall surface of the depression, a solder adsorbing film integrally continuing from said cover-side base film is formed.

11. The photoelectric conversion module according to claim 10, wherein the solder adsorbing film covers a whole area of the wall surface of the depression.

* * * * *